(12) United States Patent
Schuster

(10) Patent No.: US 7,787,177 B2
(45) Date of Patent: Aug. 31, 2010

(54) HIGH-NA PROJECTION OBJECTIVE WITH ASPHERIC LENS SURFACES

(75) Inventor: Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 353 days.

(21) Appl. No.: 12/026,592

(22) Filed: Feb. 6, 2008

(65) Prior Publication Data
US 2009/0296204 A1    Dec. 3, 2009

Related U.S. Application Data

(63) Continuation of application No. PCT/EP2006/007963, filed on Aug. 11, 2006.

(60) Provisional application No. 60/712,141, filed on Aug. 30, 2005.

(51) Int. Cl.
*G02B 23/24* (2006.01)

(52) U.S. Cl. .................. 359/362; 359/363; 359/365

(58) Field of Classification Search .......... 359/362–365
See application file for complete search history.

(56) References Cited

U.S. PATENT DOCUMENTS

| 2002/0012100 A1 | 1/2002 | Shafer |
| 2003/0011755 A1 | 1/2003 | Omura et al. |
| 2005/0190435 A1 | 9/2005 | Shafer et al. |
| 2006/0012885 A1 | 1/2006 | Beder et al. |
| 2006/0221456 A1* | 10/2006 | Shafer et al. ................ 359/649 |

FOREIGN PATENT DOCUMENTS

| EP | 0 532 267 A | 3/1993 |
| WO | WO 2004/107011 A1 | 12/2004 |
| WO | WO 2005/040890 | 5/2005 |
| WO | WO 2005/059654 | 6/2005 |
| WO | WO 2005/069055 | 7/2005 |

OTHER PUBLICATIONS

Meiron, "On the design of optical systems containing aspheric surfaces," Journal of the Optical Society of America, vol. 46, No. 4, Apr. 1956, pp. 288-292.

* cited by examiner

*Primary Examiner*—Joshua L Pritchett
(74) *Attorney, Agent, or Firm*—Fish & Richardson P.C.

(57) ABSTRACT

A projection objective for imaging a pattern provided in an object surface onto an image surface of the projection objective has an object-side imaging subsystem for creating a final intermediate image closest to the image surface from radiation coming from the object surface and an image-side imaging subsystem for directly imaging the final intermediate image onto the image surface. The image-side imaging subsystem includes at least one aspheric primary correcting lens having an aspheric primary correcting surface. The object-side imaging subsystem includes a secondary correcting group having at least one secondary correcting lens having an aspheric secondary correcting surface. Conditions involving maximum incidence angles and subaperture offsets at the correcting surfaces are given which should be observed to obtain sufficient aberration correction at very high image-side numerical apertures NA.

50 Claims, 3 Drawing Sheets

HIGH-NA PROJECTION OBJECTIVE WITH ASPHERIC LENS SURFACES

CROSS-REFERENCE TO RELATED APPLICATIONS

This application is a continuation of, and claims priority under 35 U.S.C. §120 to, international application serial number PCT/EP2006/007963, filed Aug. 11, 2006, which is incorporated herein. International application serial number PCT/EP2006/007963, filed Aug. 11, 2006 claims benefit of U.S. patent application Ser. No. 60/712,141, filed Aug. 30, 2005.

FIELD

The disclosure generally relates to a projection objective for imaging a pattern provided in an object surface of the projection objective onto an image surface of the projection objective. The projection objective may be used for microlithography projection exposure machines. The disclosure also generally relates to exposure machines for semiconductor structures which are designed for immersion operation in an aperture range where the image-side numerical aperture NA is greater than 1.0. In addition, the disclosure generally relates to related components, systems, methods of use and methods of manufacture.

BACKGROUND

In the case of reducing optical imaging, in particular in the field of projection lithography, the image-side numerical aperture NA is generally limited by the refractive index of the surrounding medium in image space adjacent to the image surface of the projection objective. In immersion lithography the theoretically possible numerical aperture NA is limited by the refractive index of the immersion medium.

The immersion medium can be a liquid or a solid. An immersion liquid is typically disposed between an exit surface of the projection objective and the surface of the substrate to be exposed, which is arranged in the image surface. In contact-free solid immersion a planar exit surface of the projection objective is arranged at a working distance smaller than the operating wavelength to the substrate to be exposed such that evanescent fields emerging from the exit surface can be used for imaging (near-filed lithography). Solid immersion with touching contact between the exit surface of the projection objective and the substrate is also possible.

SUMMARY

The theoretical limit for image-side numerical aperture is often not reached, because the propagation angles between the rays limiting the beam bundle and the optical axis then become very large. As a rule, it may be desirable for the NA to not substantially exceed approximately 95% of the refractive index of the last medium on the image side. For 193 nm, this corresponds to a numerical aperture of NA=1.35 in the case of water ($n_{H2O}$=1.43) as immersion medium.

With immersion liquids whose refractive index is higher than that of the material of the last optical element with refractive power (also denoted last lens), or in the case of solid immersion, the refractive index of the material of the last lens (i.e. the last optical element of the projection objective adjacent to the image surface) generally acts as a limitation if the design of the exit surface of the projection objective is to be planar or only weakly curved. The planar design can be advantageous, for example, for measuring the distance between wafer and objective, for hydrodynamic behaviour of the immersion medium between the wafer to be exposed and the exit surface of the projection objective, and for their cleaning. The exit surface is desirably of planar design for solid immersion, in particular, in order to expose the wafer, which is likewise planar.

For DUV (deep ultraviolet, operating wavelength of 248 nm or 193 nm), the materials normally used for the last optical element are fused silica (synthetic quartz glass, $SiO_2$) with a refractive index of $n_{SiO2}$=1.56 at 193 nm or $CaF_2$ with a refractive index of $n_{CaF2}$=1.50 at 193 nm. Given the limitations mentioned above, a numerical aperture of approximately NA=1.425 (95% of n=1.5) might be achieved if calcium fluoride is used for the last optical element. Using fused silica instead could allow numerical apertures of NA=1.48 (corresponding to approximately 95% of the refractive index of quartz at 193 nm). The relationships are similar at 248 nm.

Therefore it would be desirable to be able to produce very high NA projection objectives using only lenses made of established materials, such as fused silica. If, for example, a last optical element of a projection objective would be made of fused silica with $n_{SiO2}$=0.56 at 193 nm an increase in image-side numerical aperture towards the limit value NA=0.56 can involve very high propagation angles α are present in the last optical element. This is demonstrated by table A where the image side numerical aperture NA is listed together with the propagation angle α between marginal or coma rays and the surface normal to the planar exit surface of the projection objective (in most cases equal to half the opening angle of a beam bundle within the last optical element), and the respective sine of the maximum propagation angle α, which is the corresponding aperture sin α.

TABLE A

| NA | α [°] | Aperture sin α |
|---|---|---|
| 0.35 | 59.9 | 0.865 |
| 0.40 | 63.8 | 0.897 |
| 0.45 | 68.3 | 0.929 |
| 1.50 | 74.0 | 0.961 |

It can be difficult to control very high aperture values in the region of sin α≧0.8 or sin α≧0.9 with regard to optical correction. Since the outer coma rays impinge at very large angles, small angular deviations lead to large offsets between an ideal image point and an actual image point with regard to geometrical lateral offsets. The geometrical optical aberrations as well as the aberrations of the wavefront have to be kept very low to obtain sufficient imaging fidelity.

Thus, in some embodiments, the disclosure provides a projection objective with potential for very high image-side NA with an optical correction mechanism suitable to correct aberrations originating from high aperture values sin α≧0.8 or sin α≧0.9 within a last refracting optical element of the projection objective. In certain embodiments, the disclosure provides a projection objective with an image-side numerical aperture NA≧1.35 that can be manufactured using established lens materials, such as fused silica, only.

In one aspect, the disclosure features a projection objective configured to image a pattern provided in an object surface of the projection objective onto an image surface of the projection objective. The projection objective includes an object-side imaging subsystem configured to create an intermediate image closest to the image surface from radiation coming from the object surface. The projection objective also includes an image-side imaging subsystem configured to directly image the intermediate image onto the image surface.

The image-side imaging subsystem includes: a diverting lens group configured to create a divergent beam from radiation coming from the intermediate image; a converging lens group including an optical element closest to the image surface configured to convert the divergent beam into a convergent beam having an aperture sin $\alpha \geq 0.8$ in the optical element to provide an image-side numerical aperture NA; a primary correcting group including a primary correcting lens having an aspheric primary correcting surface formed by an image-side concave surface, the primary correcting group being in a region of the divergent beam such that a primary angular load defined by a primary local maximum SINIMAX1 for the sine of the angle of incidence of radiation on the aspheric primary correcting surface of the correcting lens is obtained and such that a primary subaperture offset SO1 is given on the primary correcting surface; and a secondary correcting group including at least one secondary correcting lens having an aspheric secondary correcting surface. The secondary correcting surface is shaped and arranged such that a secondary local maximum SINIMAX2 for the sine of the angle of incidence similar to the primary local maximum SINIMAX1 is obtained on the secondary correcting surface and arranged at a position where an absolute value of a secondary subaperture offset SO2 is similar to, but different from, the absolute value of the first subaperture offset SO1, where a subaperture offset SO between a first subaperture SA1 corresponding to a first object point of minimum height and a second subaperture SO2 corresponding to a second object point with maximum height is defined as:

$$SO = D_{SA}/DIA_{SA},$$

where $D_{SA}$ is a distance between the centers of the first and the second subaperture in an offset direction and $DIA_{SA}$ is the mean value of the diameters of the first and second subaperture in the offset direction.

In another aspect, the disclosure features a projection objective configured to image a pattern provided in an object surface of the projection objective onto an image surface of the projection objective. The projection objective includes: an object-side imaging subsystem configured to create an intermediate image closest to the image surface from radiation coming from the object surface, the object-side imaging subsystem including a first pupil surface closest to the object surface; an image-side imaging subsystem configured to directly image the intermediate image onto the image surface; and an aspheric lens arranged immediately downstream of the first pupil surface, the aspheric lens having an aspheric object-side concave entry surface facing the pupil surface. The aspheric object-side concave entry surface has an opening angle $\gamma > 60°$, and the opening angle $\gamma$ of a curved surface is defined as the angle included between an optical axis and a straight line between a center of curvature at the vertex of the curved surface and an edge of the optically used area of the curved surface.

In an additional aspect, the disclosure features a projection objective configured to image a pattern provided in an object surface of the projection objective onto an image surface of the projection objective. The projection objective has at least one pupil surface. The projection objective includes: an object-side system part between the object surface and the pupil surface, the object-side system part configured to guide radiation coming from the object surface towards the pupil surface; and an image-side system part configured to guide radiation coming from the pupil surface onto the image surface. The image-side system part includes: a last optical element closest to the image surface and being designed to create a convergent beam having an aperture sin $\alpha \geq 0.8$ in the last optical element to provide an image-side numerical aperture NA; and a first correcting group including at least one first correcting lens having a first aspheric correcting surface formed by a concave surface of the first correcting lens and arranged such that a first angular load defined by a first local maximum SINIMAX1 for the sine of the angle of incidence is obtained and such that a first subaperture offset SO1 is given on the first correcting surface. The object-side system part includes a second correcting group having at least one second correcting lens having a second aspheric correcting surface, and the second correcting surface is shaped and arranged such that a second local maximum SINIMAX2 for the sine of the angle of incidence similar to the first local maximum SINIMAX1 is obtained on the second correcting surface and arranged at a position where an absolute value of a second subaperture offset SO2 is similar to, but different from, the absolute value of the first subaperture offset SO1. A subaperture offset SO between a first subaperture SA1 corresponding to a first object point of minimum height and a second subaperture SO2 corresponding to a second object point with maximum height is defined as:

$$SO = D_{SA}/DIA_{SA}, \text{ and}$$

$D_{SA}$ is a distance between the centers of the first and the second subaperture in an offset direction, and $DIA_{SA}$ is the mean value of the diameters of the first and second subaperture in the offset direction.

In a further object, the disclosure features a projection objective configured to image a pattern provided in an object surface of the projection objective onto an image surface of the projection objective. The projection objective includes a plurality of optical elements including refractive optical elements. The plurality of optical elements are arranged and designed to image the pattern onto the image surface at a maximum image-side numerical aperture NA>1.35. All the refractive optical elements are made of fused silica.

In certain embodiments, the disclosure provides a projection objective for imaging a pattern provided in an object surface of the projection objective onto an image surface of the projection objective, where the projection objective includes an object-side imaging subsystem for creating a final intermediate image closest to the image surface from radiation coming from the object surface. The projection objective also includes an image-side imaging subsystem for directly imaging the final intermediate image onto the image surface. The image-side imaging subsystem includes a diverting lens group for creating a divergent beam from radiation coming from the final intermediate image and a converging lens group including a last optical element closest to the image surface for converting the divergent beam into a convergent beam having an aperture sin $\alpha \geq 0.8$ in the last optical element to provide an image-side numerical aperture NA. The image-side imaging subsystem includes a primary correcting group having a primary correcting lens having an aspheric primary correcting surface formed by an image-side concave surface of the primary correcting lens and arranged in the region of divergent beam such that a primary angular load defined by a primary local maximum SINIMAX1 for the sine of the angle of incidence is obtained and such that a primary subaperture offset SO1 is given on the primary correcting surface. The object-side imaging subsystem includes a secondary correcting group having at least one secondary correcting lens having an aspheric secondary correcting surface. The secondary correcting surface is shaped and arranged such that a secondary local maximum SINIMAX2 for the sine of the angle of incidence similar to the primary local maximum SINIMAX1 is obtained on the secondary correcting surface and arranged at a position where an absolute value of a secondary subaperture offset SO2 is similar to, but different from, the absolute value of the first subaperture offset SO1. A subaperture offset SO between a first subaperture SA1 corresponding to a first object point of minimum height and a second subaperture SA2 corresponding to a second object point with maximum height is defined as:

$$SO=D_{SA}/DIA_{SA},$$

where $D_{SA}$ is a distance between the centers of the first and the second subaperture in an offset direction and $DIA_{SA}$ is the mean value of the diameters of the first and second subaperture in the offset direction.

In some embodiments, the following conditions are fulfilled (1) SINIMAX1>0.85
(2) SINIMAX2>0.85
(3) SO1/SO2≠1
(4) LL≦|(SO1/SO2)|≦UL where LL=3 and UL=25, or LL=1/25 and UL=1/3.

The disclosure can be particularly advantageous for projection objectives with NA≧0.35.

In some embodiments, the disclosure provides optical correction by using aspheric lens surfaces or groups of aspheric lens surfaces arranged in selected, spatially separated regions of the projection objective such that an overall correcting effect can be obtained by distributing the correcting effect into at least two geometrically separate regions of the projection objective, where one of the regions is positioned in the image-side imaging subsystem in a region of divergent radiation and the other is positioned around a "load conjugate" position upstream of the final intermediate image, i.e. further away from the image surface.

The term "load conjugate" as used here is intended to encompass mutually associated regions within the projection objective which are geometrically spaced apart from each other and separated by at least one intermediate image, but where similar conditions with respect to correction potential for selected aberrations are given. It has been found that one feature for an effective correction can be that at least one aspheric surface is placed at a position where a very high maximum angle of incidence, i.e. a high angular load, is obtained at the aspheric surface.

Further, it has been found that it may be difficult to concentrate all the desired variation of refractive power over the beam height provided by an aspheric surface in only one position of the projection objective. Therefore, it is proposed to divide the correcting effect between at least two "load conjugate" regions on either side of an intermediate image which are characterized by the fact that similar, but not identical conditions prevail with regard to the "subaperture offset", which characterizes the potential of an aspheric surface to act on coma rays of the beam bundle in a defined manner.

The term "coma ray" as used here defines a ray emanating from an off-axis object point and running to the edge of an aperture stop limiting the diameter of the beam-bundle and placed at or close to a pupil surface of the projection objective. Two selected coma rays will be used throughout the specification to characterize specific features of the disclosure. The term "upper coma ray" refers to a coma ray having an increasing distance to the optical axis in propagation direction, i.e. running away from the optical axis near the object surface. The term "lower coma ray", in contrast, refers to a coma ray having a decreasing distance to the optical axis in propagation direction, i.e. running towards the optical axis near the object surface.

The aspect of the very high angles of incidence at aspheric surfaces is reflected by values regarding the maximum value for the sine of the angle of incidence (SINIMAX) on the primary and secondary correcting surface. Particularly if the conditions SINIMAX1>0.85 and SINIMAX2>0.85 are met, a potential for strong correcting effect is given.

It is to be understood that these values correspond to the incidence angles given when the projection objective is used with maximum NA. The "sine of the angle of incidence" of a ray at a surface is understood as the product n*sin(i) of the refractive index n of the medium situated upstream of the surface in the light propagation direction, and the sine of the angle i of incidence. The angle of incidence is in this case the angle enclosed by the light ray and the surface normal at the point of impingement. The "maximum sine of the angle of incidence" (SINIMAX) at a surface is understood as the maximum value of the sine of the angle of incidence over all light rays impinging on this surface.

The aspect of similar, but not identical situations with regard to the "subaperture offset" is now discussed. If the subaperture offsets SO1 and SO2 at the primary and secondary correcting surface, respectively, are identical, then an amplification of the correcting effect of both correcting surfaces may be obtained given a suitable aspheric surface shape. However, if a distinct, but not too large difference is given, the correcting effects of the primary and secondary correcting surfaces may complement each other to obtain an overall correcting effect not possible with one of the correcting surfaces only.

It has been found that certain conditions for the subaperture offset ratio SO1/SO2 should be met to obtain optimum correcting effects. Specifically, strong correction can be obtained if the absolute value |(SO1/SO2)| of the subaperture offset ratio lies between a lower limit LL and an upper limit UL. In some embodiments, LL=3 and UL=25 or LL=1/25 and UL=1/3, meaning that either the limiting values 3 and 25 or their reciprocal values 1/25 and 1/3 limit the range.

In certain embodiments, LL=3 and UL=6, or LL=1/6 and UL=1/3.

It has been found that certain intervals for the absolute value of the subaperture offset ratio may be particularly beneficial. One interval may be characterized by LL=3 and UL=4 or LL=1/4 and UL=1/3. Another interval may be characterized by LL=5 and UL=6 or LL=1/6 and UL=1/5. Yet another interval may be characterized by LL=15 and UL=25 or LL=1/25 and UL=1/15.

Alternatively, or in addition, certain combinations of intervals for the absolute value |SO| of the subaperturte offset appear to be beneficial in order to obtain sufficient correction. Specifically, if one aspheric correcting surface is positioned such that one of the following three conditions (1) to (3) is fulfilled for |SO|, then it is beneficial that another aspheric correcting surface is present at a position where one of the other two remaining conditions is fulfilled. The conditions are as follows:

(1) 0<|SO|<0.025
(2) 0.04<|SO|<0.120
(3) 0.200<|SO|<0.400

Regarding useful high angular loads at the correcting surfaces, the conditions SINIMAX1>0.90 and SINIMAX2>0.90 are met in some embodiments. In certain embodiments, the conditions SINIMAX1>0.925 and SINIMAX2>0.925 are met.

Typically the condition SINIMAX1>SINIMAX2 holds such that the highest maximum values for the sine of the incidence angle appear on the primary correcting surface.

Independent from the type of projection objective (refractive or catadioptric) the optical elements immediately upstream of the image surface are generally responsible for guiding and/or effecting high aperture values needed for image-side numerical apertures significantly larger than 1. Usually, the aperture is provided by the converging action of a number of immediately consecutive positive lenses close to the image surface. The region of convergent beam is normally preceded by a region where the divergence angle of a divergent beam is being reduced by further positive lenses arranged between a region of a local minimum in beam diameter and the region of a local maximum of beam diameter closest to the image surface. Therefore, a typical design with high NA has the region of minimum beam diameter closest to the image surface (frequently shaped and denoted as "waist") followed by an image-side "bulge" or "belly" immediately upstream of the image surface. Whereas one or more negative lenses may be positioned in the image-side belly in low NA designs in order to contribute to aberration correction, for example with regard to spherical aberration, typical embodiments of high NA objectives according to the disclosure have only positive lenses within the image-side belly in order avoid extreme lens diameters.

In some embodiments, the lens or lenses of the primary correcting group are positioned immediately upstream of the image-side belly. Specifically, the primary correcting lens may be a negative lens having an image-side concave surface immediately followed by a group of five lenses including at least four positive lenses. In many cases there are only positive lenses between the primary correcting lens and the image surface. Typically there is at most one non-positive lens between the primary correcting lens and the image surface. For example, at least five positive lenses may be arranged between the primary correcting lens and the image surface and/or at least 80% of all lenses between the primary correcting lens and the image surface are positive lenses.

It has been found it can be advantageous if the primary correcting group includes at least two negative lenses each having an aspheric image-side concave surface arranged in the region of divergent beam. More complex correction effects can be obtained this way by using aspheric surfaces with moderate aspheric shapes.

In some embodiments, the primary correcting lens is a biconcave negative lens.

In certain embodiments, the primary correcting lens is a biaspherical lens having aspheric entry surface and aspheric exit surface. A complex distribution of refractive power across the beam diameter can be obtained this way in an axially narrow region.

In some embodiments, the secondary correcting group includes a secondary correcting lens formed by a lens having an aspheric object-side concave surface arranged in a position selected such that the primary and the secondary subaperture offset have opposite signs. In this case, the secondary correcting surface may complement and intensify the correcting effect of the primary correcting lens with high efficiency. The secondary correcting lens is a mensiscus lens in some embodiments. Although the lens surface of the secondary correcting lens opposite to the secondary correction surface may be spherical, this lens surface is aspherical in other embodiments such that the secondary correcting lens is a biaspherical lens.

It has been found it can be advantageous for the meniscus lens is bent strongly such that an opening angle γ of the secondary correcting surface exceeds 60° and/or 70° and/or 80°. Here, the opening angle γ of a curved surface is defined as the angle included between the optical axis and a straight line between the center of curvature at the vertex of the curved surface and the edge of the optically used area of the curved surface. With other words: if $R_C$ is the radius of curvature and $h_{max}$ is the maximum height of the surface then $\gamma = \arcsin(h_{max}/R_C)$. Therefore, as an opening angle approaches 90°, the curved surface assumes approximately a hemispherical shape. Surfaces with large opening angles are capable of providing aberration contributions (or correction contributions) at the highest orders, which has been found desirable for correcting aberrations in very high NA objectives.

Alternatively, or in addition, the secondary correcting group may include a secondary correcting lens having an aspheric image-side concave surface arranged at a position where the primary and secondary subaperture offset have the same sign. In this case, the subapertures corresponding to the object points having maximum and minimum height, respectively, are offset from each other in the same relative direction as on the primary correcting surface indicating that a similarly correcting effect amplifying and complementing the correcting effect of the primary correcting surface can be obtained.

The lens having an aspheric image-side concave surface may be a meniscus lens, which may have one aspheric surface (on the concave side) or two aspheric surfaces (biaspherical lens).

According to another aspect, the disclosure provides a projection objective having an image-side imaging subsystem immediately downstream of the object surface including a first pupil surface closest to the object surface, wherein an aspheric lens is arranged immediately downstream of the first pupil surface having an aspheric object-side concave entry surface facing the pupil surface, wherein the entry surface has an opening angle γ>60°. The concave aspheric entry surface may function as a secondary correcting surface.

In some embodiments, γ>70°, e.g., γ>80°. The opening angle may be asymmetric in relation to the optical axis for free openings due to an asymmetric image field, which may particularly be positioned outside the optical axis. The lens carrying the close-to-hemispherical surface may be cut asymmetrically to accommodate an aperture stop aligned obliquely (i.e. at a non-rectangular angle) with respect to the optical axis.

The aspheric lens having the aspheric entry surface can have positive refractive power. The lens may be a meniscus lens. The exit side of the lens may be spherical or aspherical, thereby making the lens a biaspherical lens.

In addition, the projection objective having a first pupil surface closest to the object surface may have at least one aspheric lens between the object surface and the first pupil surface, wherein the lens has an image-side concave exit surface facing the first pupil surface and wherein the surface is aspheric and has an opening angle γ>60°.

The aspheric lens having the aspheric exit surface can have positive refractive power. The lens may be a meniscus lens. The entry side of the lens may be spherical or aspheric, thereby making the lens a biaspherical lens.

The distribution of correcting effect into at least two geometrically separate regions of the projection objective may also be accomplished if the two separate regions are disposed on either side of a pupil surface in mutually load conjugate positions upstream and downstream of the pupil surface. If there is no intermediate image formed between the load conjugate positions on either side of the pupil surface, the relative positions of the subapertures of the first and second beam bundles are different on either side of the pupil surface such that, in a direction perpendicular to the optical axis, on one side the first subaperture SA1 lies below the second subaperture SA2, whereas on the other side the second subaperture lies below the first subaperture SA1.

The disclosure can provide a projection objective for imaging a pattern provided in an object surface of the projection objective onto an image surface of the projection objective. The projection objective has at least one pupil surface. The projection objective includes an object-side system part between the object surface and the pupil surface for guiding radiation coming from the object surface towards the pupil surface. The projection objective also includes an image-side system part for guiding radiation coming from the pupil surface onto the image surface, the image-side system part including a last optical element closest to the image surface and being designed for creating a convergent beam having an aperture sin α≧0.8 in the last optical element to provide an image-side numerical aperture NA. The image-side system part includes a first correcting group having at least one first correcting lens having a first aspheric correcting surface formed by a concave surface of the first correcting lens and arranged such that a first angular load defined by a first local maximum SINIMAX1 for the sine of the angle of incidence is obtained and such that a first subaperture offset S01 is given on the first correcting surface. The object-side system part includes a second correcting group having at least one second correcting lens having a second aspheric correcting surface. The second correcting surface is shaped and arranged such that a second local maximum SINIMAX2 for the sine of the angle of incidence similar to the first local maximum SINIMAX1 is obtained on the second correcting surface and arranged at a position where an absolute value of a second subaperture offset SO2 is similar to, but different from, the absolute value of the first subaperture offset SO1. A subaperture offset SO between a first subaperture SA1 corresponding to a first object point of minimum height and a second subaperture SO2 corresponding to a second object point with maximum height is defined as:

$$SO = D_{SA}/DIA_{SA},$$

where $D_{SA}$ is a distance between the centers of the first and the second subaperture in an offset direction and $DIA_{SA}$ is the mean value of the diameters of the first and second subaperture in the offset direction.

A strong overall correcting effect with complementing contributions from spatially separated aspheric correcting surfaces may also be utilized in optical systems having no intermediate image or within an optical system consisting of at least two concatenated imaging subsystems, where the correaction and compensation takes place within an imaging sub-system. For example, the projection objective may have at least one intermediate image and, as a consequence, at least two pupil surfaces. The pupil surface included between the first and second correction surface may be the first pupil surface closest to the object surface. In any case, a pair of associated correcting surfaces having high angular loads situated upstream and down-stream of the same pupil surface may contribute to correction. The change of the sign of the subaperture offset between positions upstream and downstream of the same pupil surface contribute to solve correction problems particularly in the edge region of a pupil at high ray heights since the correction of these regions may be influenced with varying weight by the associated correcting surfaces.

The projection objective may have two pupil surfaces and exactly one intermediate image. In some embodiments, the projection objective has exactly two intermediate images and three pupil surfaces.

It has been found that high spatial densities of aspheric surfaces may be beneficial around the primary and/or secondary correcting surface. Conditions and considerations regarding the aspect of high spatial densities of aspheric surfaces also applicable to the present disclosure are disclosed in U.S. patent application with Ser. No. 11/151,465 and title: "Projection objective having a high aperture and a planar end surface" filed on Jun. 14, 2005 by the applicant. The disclosure of the patent application is incorporated herein entirely by reference.

According to another aspect of the disclosure, there is provided a projection objective for imaging a pattern provided in an object surface of the projection objective onto an image surface of the projection objective. The projection objective includes a plurality of optical elements including refractive optical elements. The plurality of optical elements is arranged and designed to image the pattern onto the image surface at a maximum image-side numerical aperture NA>1.35. All refractive optical elements are made of fused silica.

High resolution projection objectives can thereby be obtained at reasonable costs since fused silica is available in sufficient quantities at very high optical quality, and processes for manufacturing of lenses and other optical elements from fused silica are well established. The image-side numerical aperture may be in the range 1.35<NA≦1.50. The projection objective may be a catadioptric projection objective where the optical elements include at least one concave mirror. Exactly two concave mirrors are provided in some embodiments. In some embodiments the projection objective has at least one intermediate image between the object surface and the image surface. Although at least one planar folding mirror or two folding mirrors may be present, in some embodiments the projection objective is rotational symmetric and has one straight optical axis common to all optical elements, and no folding mirror (In-line system). Mechanical stability is thereby obtained and incorporation into wafer steppers or wafer scanners is facilitated. The rotationally symmetric in-line projection objective may be a catadioptric projection objective where the optical elements include exactly two concave mirrors.

The previous and other properties can be seen not only in the claims but also in the description and the drawings, wherein individual characteristics may be used either alone or in sub-combinations as an embodiment of the disclosure and in other areas and may individually represent advantageous and patentable embodiments.

DETAILED DESCRIPTION

In the following description, the term "optical axis" shall refer to a straight line or sequence of straight-line segments passing through the centers of curvature of the optical elements involved. The optical axis can be folded by folding mirrors (deflecting mirrors). In the case of those examples presented here, the object involved is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Where tables are provided to disclose the specification of a design shown in a figure, the table or tables are designated by the same numbers as the respective figures.

Figure 1:
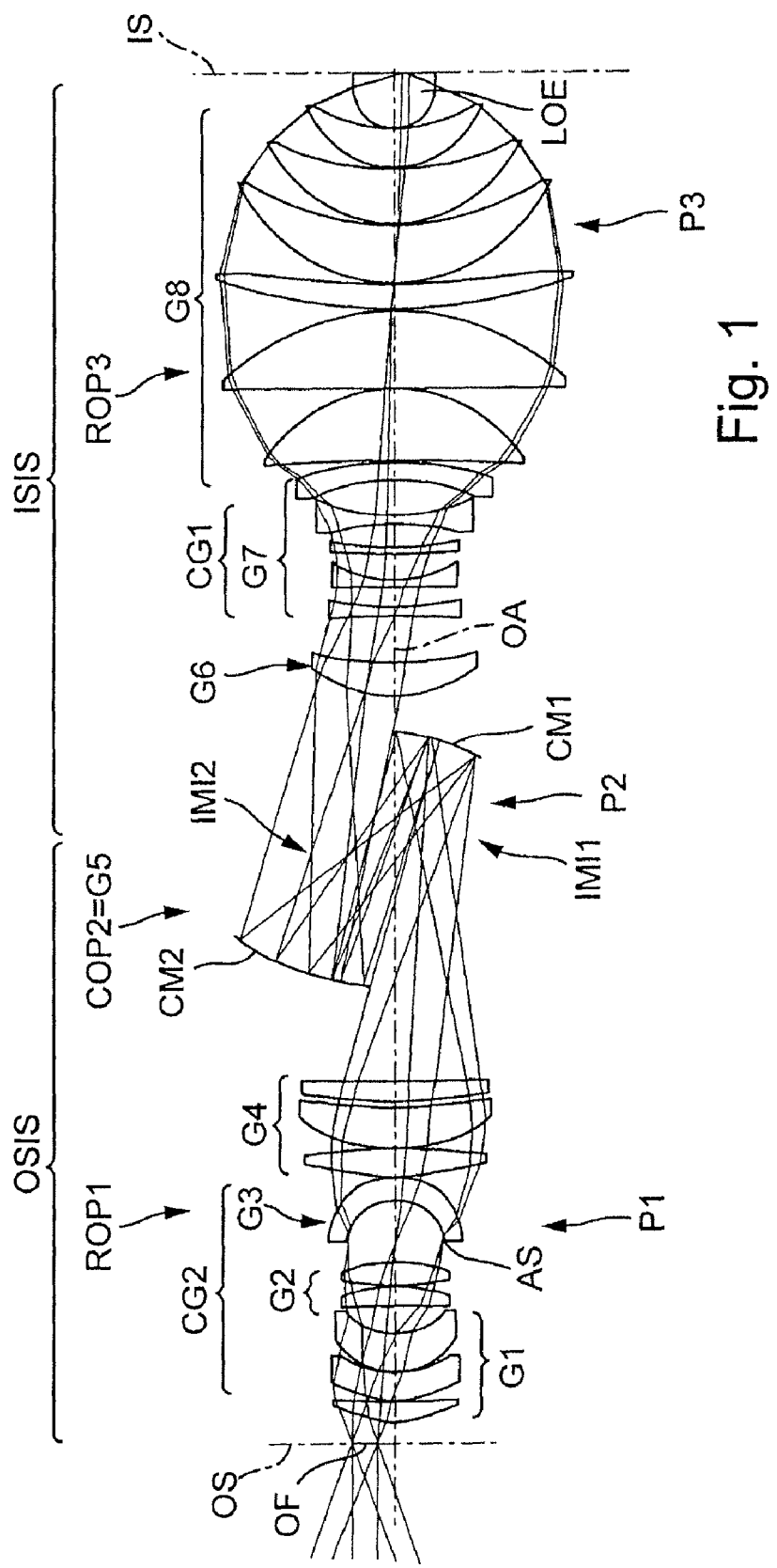
FIG. 1 is a longitudinally sectioned view (meridional section) of a catadioptric projection objective.

FIG. 1 shows a first embodiment of a catadioptric projection objective 100 according to the disclosure designed for ca. 193 nm UV working wavelength. It is designed to project an image of a pattern on a reticle (or mask) arranged in the planar object surface OS into the planar image surface IS on a reduced scale, for example, 4:1, while creating exactly two real intermediate images IMI1 and IMI2. A first refractive objective part ROP1 is designed for imaging the pattern arranged in the region of the object field OF in the object surface into the first intermediate image IMI1, a second, catoptric (purely reflective) objective part COP2 images the first intermediate image IMI1 into the second intermediate image IMI2, and a third, refractive objective part ROP3 images the second intermediate image IMI2 onto the image surface IS with a strong reduction ratio.

The second objective part COP2 includes a first concave mirror CM1 having the concave mirror surface facing the object side, and a second concave mirror CM2 having the concave mirror surface facing the image side. The mirror surfaces are both continuous or unbroken, i.e. they do not have a hole or bore. The mirror surfaces facing each other define an intermirror space, enclosed by the curved surfaces defined by the concave mirrors. The intermediate images IMI1, IMI2 (at least the paraxial intermediate images) are both situated geometrically inside the intermirror space apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry. The Projection objective is rotational symmetric and has one straight optical axis OA common to all refractive and reflective optical components. There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting.

Catadioptric projection objectives having this general construction are disclosed e.g. in the U.S. patent application with Ser. Nos. 11/035,103 filed on Jan. 14, 2005. The contents of this application is incorporated into this application by reference. It is one characterizing feature of this type of catadioptric projection objectives that all concave mirrors are arranged optically remote from a pupil surface, particularly at positions where the chief ray height of the imaging process exceeds a marginal ray height of the imaging process. Further, it can be advantageous if at least the first intermediate image is located geometrically within the intermirror space. Optionally, both intermediate images are located geometrically within the intermirror space. This basic type of design allows immersion lithography at numerical apertures NA>1 with optical systems that can be built with relatively small amounts of optical material.

The specifications for the design of FIG. 1 are summarized in Table 1. The leftmost column lists the number of the refractive, reflective, or otherwise designated surface, the second column lists the radius, r, of the surface [mm], the third column lists the distance, d [mm], between the surface and the next surface, a parameter that is referred to as the "thickness" of the optical element, the fourth column lists the material employed for fabricating the optical element, and the fifth column lists the refractive index of the material employed for its fabrication. The sixth column lists the optically utilizable, clear, semi diameter [mm] of the optical component. In the tables, a radius value r=0 is given for planar surfaces having infinite radius.

In the case of this particular embodiment, a large fraction of optical surfaces are aspherical surfaces. Table 1A lists the associated data for those aspherical surfaces, from which the sagitta of their surface figures as a function of the height h may be computed employing the following equation:

$$p(h)=[((1/r)h^2)/(1+\text{SQRT}(1-(1+K)(1/r)^2 h^2))]+C1 \cdot h^4 + C2 \cdot h^6 + \ldots,$$

where the reciprocal value (1/r) of the radius is the curvature of the surface in question at the surface vertex and h is the distance of a point thereon from the optical axis. The sagitta p(h) thus represents the distance of the point from the vertex of the surface in question, measured along the z-direction, i.e., along the optical axis. The constants K, C1, C2, etc., are listed in Table 1A.

The projection objective 100 is designed for microlithography at 193 nm at an image-side working distance of 1 mm and has an image-side numerical aperture NA=1.50 at an image field size 4 mm·18 mm, where the off-axis rectangular image field is used. The track length (axial distance between object plane and image plane) is 1370 mm. The optical correction for aberrations is characterized by a wavefront error (RMS) equal to or smaller than 6.0 mλ for all image heights between 4.375 and 10.375. All lenses are made of fused silica.

A first pupil surface P1 is formed within the first, refractive objective part ROP1 between object surface OS and first intermediate image IMI1 at a position where the chief ray CR intersects the optical axis OA. A second pupil surface P2 is present within the second, catoptric objective part COP2 between the first and second intermediate images between the concave mirrors CM1 and CM2 where the chief ray CR intersects the optical axis. A third pupil surface P3 is formed within the third, refractive objective part ROP3 where the chief ray CR intersects the optical axis a third time prior to impinging on the image surface. An aperture stop AS is positioned within the first objective part ROP1 close to the first pupil surface P1. The planar aperture stop is placed obliquely (at a non-rectangular angle) and decetered with respect to the optical axis. The lens immediately following the aperture stop is cut asymmetrically to accommodate the structure for the aperture stop (see FIG. 2).

The projection objective 100 is one example for a certain type of projection objective having an object-side imaging subsystem OSIS for creating a final intermediate image closest to the image surface (identical to the second intermediate image IMI2) and a subsequent image-side imaging subsystem ISIS (identical with the second refractive objective part ROP2) for imaging the final intermediate image IMI2 directly, i.e. without further intermediate image, onto the image surface. In this particular case, the object-side imaging subsystem OSIS includes two concatenated objective parts ROP1 and COP2, wherein each of the objective parts forms an imaging subsystem. In this case, one intermediate image, namely the first intermediate image IMI1, is formed within the object-side imaging subsystem.

Figure 2:
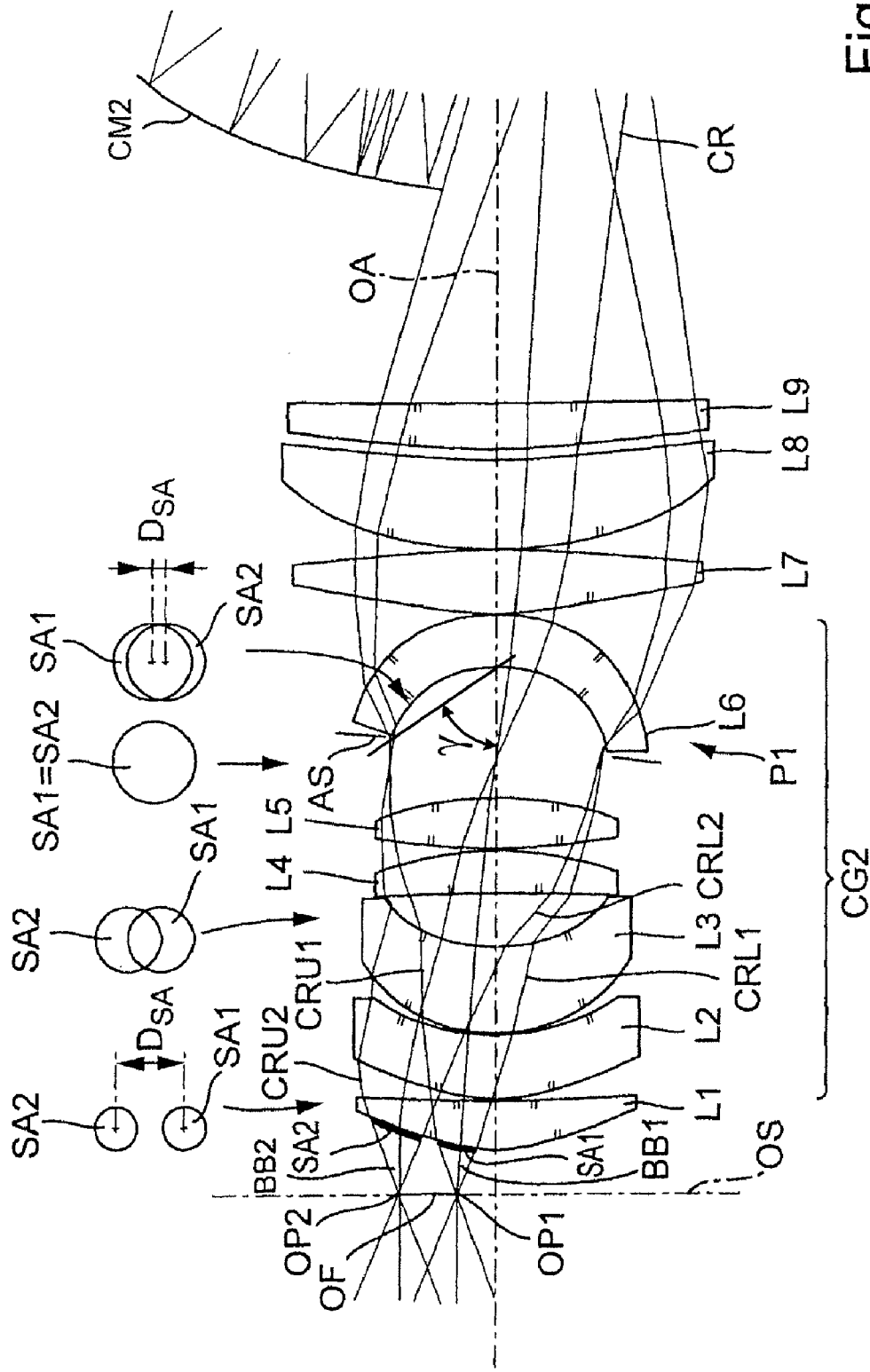
FIG. 2 is an enlarged detail of the object-side end of the projection objective in FIG. 1.

Some optical properties of the projection objective become evident if the course of selected coma rays and the course of beam bundles emerging from selected object field points is considered. For this purpose, FIGS. 1 and 2 show a beam bundle BB1 originating from an object point OP1 with minimum height, i.e. the object point of the object field positioned closest to the optical axis in the meridional section, and a second beam bundle BB2 originating from a second object point OP2 of the object field furthest apart from the optical axis in the meridional section. The outer periphery of each of the beam bundles is represented by respective upper and lower coma rays CRU1, CRL1 and CRU2, CRL2 respectively. In this representation, the coma rays are useful, for example, to identify the approximate position of intermediate images. For example, the first intermediate image IMI1 is formed between the intersection points of the upper and lower coma ray of the object point OP1 closest to the optical axis and the second object point OP2 farthest away from the optical axis. The first intermediate image is formed on the side of the optical axis opposite to the side of the original object field OF whereas the second intermediate image is formed on the side of the object field OF The coma rays of the selected object points exit from the respective object points under certain angles with respect to a direction parallel to the optical axis, where this opening angle of a beam bundle is defined by the object-side numerical aperture. As evident from FIG. 2, each selected beam bundle intersects the lens surfaces in regions defined by the intersection points of the upper and lower coma ray of a beam with the lens surface. The "footprint" (intersection zone) of a beam bundle of a specific object point on an optical surface is denoted "subaperture" in this specification. For example, the subapertures SA1, SA2 corresponding to the object points OP1 and OP2 on the first lens surface of the projection objective (convex surface closest to the object surface OS) are indicated in bold lines in FIG. 2.

It is evident and shown schematically in FIG. 2 that at a position close to a field surface the subapertures of the selected beam bundle may not overlap but lie with a distance there between. As the axial position approaches a pupil surface, the size of the subapertures increases and an increasing overlap of the subapertures occurs. At the position of the first pupil surface, for example, the subapertures of the selected object points overlap essentially completely. As the distance to the object surface increases beyond the first pupil surface, respective subapertures become increasingly smaller and the overlap decreases until the subapertures are separate again at the first intermediate image IMI1.

It is worth to note that the relative position of the subapertures of the first and second beam bundles are different on either side of a pupil surface. For example, the subapertures SA2 of the second beam bundle BB2 are positioned farther away from the optical axis (at larger absolute ray height values) than those of the first beam bundle. In the region between object surface and first pupil surface, the ray height values may be regarded with positive sign, whereas behind the first pupil surface, i.e. between the pupil surface and the first intermediate image, the ray height values have negative sign. Thus the subaperture SA2 is above the subaperture SA1 in the region between object surface and first pupil surface, and the situation is reversed in the region after the first pupil surface and before the first intermediate image. These conditions are important for the purpose of aberration correction, as will be explained below.

It is a general observation that correction may be relatively simple for regions close to the optical axis, whereas the correction becomes increasingly more difficult as the considered region approaches the edge region of a pupil, which corresponds to the regions of largest ray height values. The relative positions of the first and second beam bundle along the height region (perpendicular to the optical axis) are different on either side of the pupil surface. This effect is reflected by the change of sign of the subaperture offset SO. Due to the reversal of relative positions with respect to the largest values of the ray height new degrees of freedom for correction are obtained if, at the same time, high angular loads are obtained at the associated correcting surfaces upstream and downstream of the pupil surface, since a strong correction and mutual compensation of undesired influence on the wavefront can be obtained at the same time.

It is considered useful to define axial positions of lens surfaces in dependence on a corresponding "subaperture offset" SO between the first subaperture SA1 corresponding to the first object point having minimum height and a second subaperture SO2 corresponding to a second object point with maximum height as: SO=$D_{SA}$/DIA$_{SA}$, where $D_{SA}$ is a distance between the centers of the first and the second subaperture in an offset direction and DIA$_{SA}$ is the mean value of the diameters of the first and second subaperture in the offset direction.

As evident from FIG. 2, the value of the subaperture offset SO approaches 0 as the axial position gets closer to a pupil surface (where $D_{SA}$=0) and reaches a maximum value in a field surface.

Figure 3:
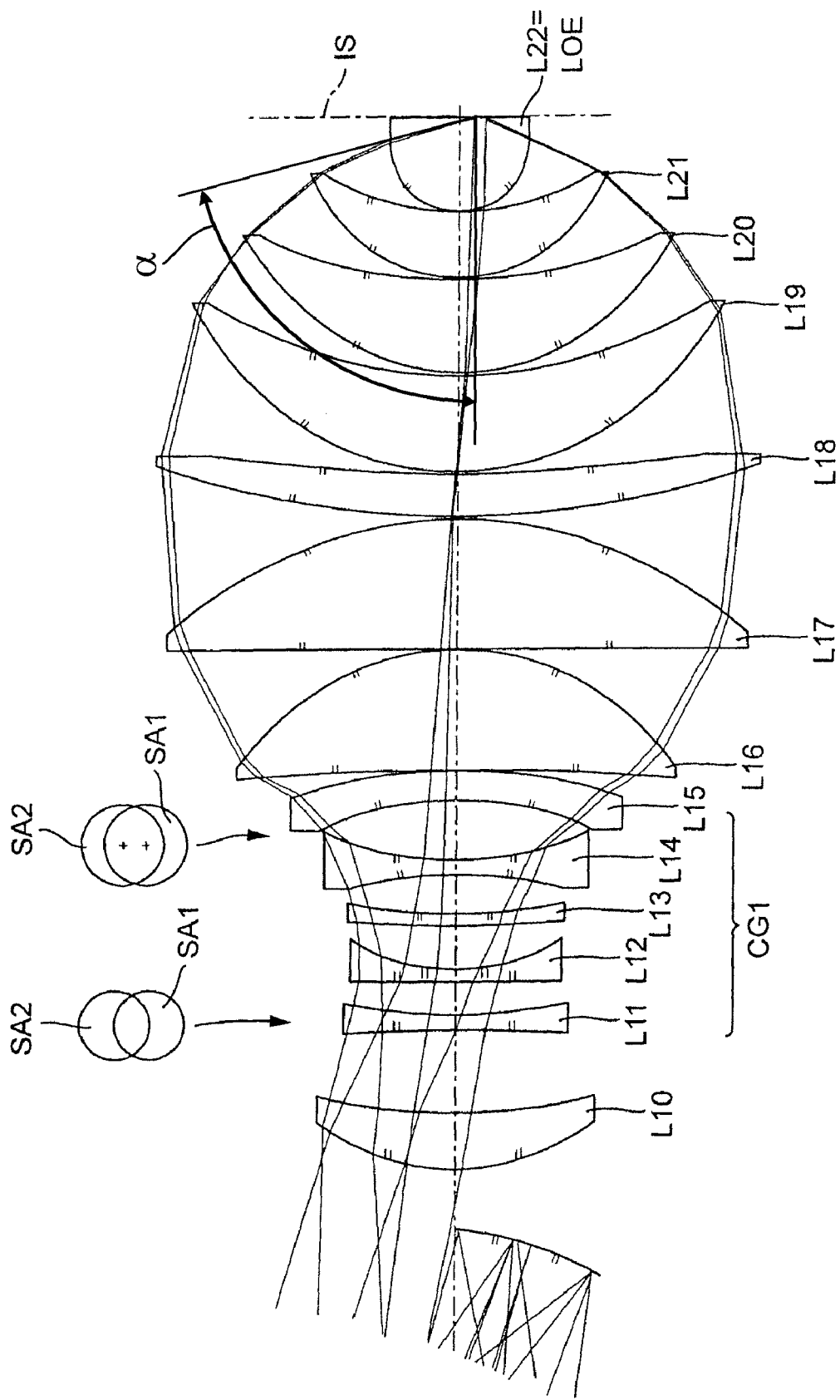
FIG. 3 is an enlarged detail of the image-side end of the projection objective in FIG. 1.

These conditions qualitatively explained in connection with FIGS. 1 to 3 are quantified in Table 1S for the system of Table 1. The leftmost column lists the numbers of refractive, reflective or otherwise designated surfaces. The second column lists the maximum value SINIMAX for the sine of the angles of incidence at maximum usable aperture. The third column lists the mean value H1 of the height of the upper coma ray CRU1 and the lower coma ray CRL1 of the beam originating from the first object point OP1 with minimum height. Note that this mean value is generally similar, but not identical to the height of the respective chief ray corresponding to the respective object point. The fourth column lists the mean value H2 of the heights of upper coma ray CRU2 and lower coma ray CRU1 of the second beam bundle BB2 originating from OP2. The fifth column lists the diameter D1 of the first beam bundle BB1 in the meridional direction, which corresponds to the difference between the heights of the corresponding upper and lower coma rays CRU1 and CRL1. Likewise, the sixth column lists the respective values for the second beam bundle corresponding to the second object point OP2. The seventh column lists the subaperture offset SO at the respective surface derived according to the equation:

$$SO=(H2-H1)/[(D1+D2)/2]$$

which corresponds to the equation: SO=$D_{SA}$/DIA$_{SA}$.

From Table 1S it is evident that the absolute value of the subaperture offset attains its maximum at the object surface (surface #0) and the image surface (surface #50) and approaches zero at pupil surfaces (e.g. first pupil surface P1 corresponding to surface #11). Further, the sign of the subaperture offset (positive or negative) is different on either side of a pupil surface indicating that the relative positions of the beam bundles originating from the first and second object point switch their position with regard to their relative heights. For example, between the object surface OS and the first pupil surface P1 a first beam bundle BB1 has a smaller medium height (given by the mean value of the heights of upper and lower coma ray) than the second beam bundle BB2, whereas downstream of the first pupil surface between P1 and the first intermediate image the conditions are reverse.

The highest maximum incidence angles are obtained at the planar exit surface (#49) of the projection objective, where SINIMAX=0.962. Comparable values are obtained within the projection objective at surfaces #33 (SINIMAX=0.957), #12 (SINIMAX=0.944) and #6 (SINIMAX=0.936). Here, the highest value is obtained for the primary correcting surface (#33).

The absolute values of the subaperture offset for the primary correcting surface (#33) and the most effective secondary correcting surface (#12) are significantly different from zero, and have similar, but not identical absolute values (−0.081 versus 0.015).

The sequence and type of optical elements in the projection objective will now be described in detail. On the object-side the design of the lenses immediately downstream of the object surface is optimized to provide object-side telecentricity and a very low level of distortion. The entry-side of the first refractive objective part ROP1 arranged between object surface and first pupil surface P1 is functionally sub-divided into two groups G1 and G2 of positive lenses. No negative lens is provided upstream of the aperture stop. The first group G1 is formed by three biaspherical positive meniscus lenses L1, L2 and L3, where the curvature radius of the local curvature at the vertex and outside the optical axis are on the image-side primarily to secure object-side telecentricity. Very high incidence angles occur at the concave exit side (Surface #6) of lens L3.

The second group G2 immediately upstream of the aperture stop consists of positive lenses L4, L5, where L4 is strongly aspheric on the entry side and L5 is a biaspherical lens.

The third group G3 immediately downstream of the first pupil surface P1 is designed as a single biaspherical positive meniscus lens having an object-side concave entry surface (#33), where very high incidence angles occur.

The fourth group G4 downstream of meniscus L6 is formed by three consecutive positive lenses, namely, biconvex lens L7, meniscus lens L8 and a weakly-curved meniscus lens L9 having positive refractive power around the optical axis and a region of negative refractive power towards the perimeter of the lens.

The second, catoptric objective part COP2 is formed by two aspheric concave mirrors CM1, CM2 and serves as an imaging subsystem to image a first intermediate image IMI1 onto the second intermediate image IMI2, which is strongly aberrated.

A lens group G6 immediately following the second concave mirror is formed by single positive meniscus lens L10 having an aspheric entry surface and a concave, spherical exit surface.

A lens group G7 including five consecutive negative lenses L11-L15 provides overcorrection for the subsequent positive lenses of a lens group G8, which is designed primarily to provide the high image-side numerical aperture. This lens group G8 consists of six immediately consecutive positive lenses L16-L21 immediately upstream of the last optical element LOE (lens L22) formed by a piano-convex lens having an aspherically curved entry surface with small curvature radius and a planar exit surface facing the image surface IS, which lies at a distance of 1 mm to the exit surface of the projection objective.

The image-side imaging sub-system ISIS shown in detail in FIG. 3 is effective to first diverge the beam coming from the second intermediate image IMI 2 (final intermediate image) and then converging the beam towards the image surface. An image-side belly including lens L18 of largest diameter is thereby formed including positive lenses only. The concentration of positive optical power is preceded by a concentration of negative refractive power provided by group G7 to form a "waist" in the beam. In the concept of the disclosure, these negative lenses form a primary correcting group CG1 which provides a major contribution to the correction of aperture-driven image aberrations such as oblique spherical aberrations in sagittal and meridional direction.

It has been found that the most relevant (effective) surfaces are those lens surfaces on the image-side having a center of curvature also on the image side. With other words, image-side concave surfaces of negative lenses appear to be very effective. Moreover, it has been found that such negative lenses closest to the image-side belly are most effective. Due to the large geometrical distance between the positive lenses of the image-side belly and the correcting surfaces very large correction contributions with highest orders need to be provided. This is made possible mainly by shaping and arranging these image-side concave surfaces such that a high angular load is obtained. The high angular load is characterized by large maximum incidence angles of radiation at an optical surface. The largest value for the sine of an incidence angle (SINIMAX) in this region is obtained for the exit surface (#33) of biconcave negative lens L14 in the region of divergent beam. Due to the high correcting efficiency, this lens is denoted primary correcting lens in this specification, where the concave exit side is a primary correction surface, which is aspheric to obtain best correcting results. The aspheric concave exit surface of lens L12 contributes significantly to primary correction. The primary correcting surface in this embodiment is characterized by SINIMAX1=0.957 and a subaperture offset SO1=−0.081.

It has been found that the correcting effect of the primary correcting group may not be sufficient, particularly, if the aperture values sin α in the last optical element are significantly increased above sin α=0.9, e.g. up to sin α=0.95 or above. In order to provide further complementary and intensifying contributions to aberration correction, the projection objective includes a secondary correction group CG2 arranged in the image-side imaging subsystem ISIS around the first pupil surface P1. The secondary correcting group CG2 includes aspheric surfaces shaped and arranged such that they influence primarily the upper coma rays of the beam bundle either with similar height ratios as in the primary correcting group, or in a complementary manner with switched height ratios.

The object-side concave biaspherical meniscus lens L6 immediately down-stream of the first pupil surface P1 forms a secondary correcting lens designed to complement and intensify the correcting effect of the primary correcting group CG1. The aspheric secondary correcting lens is designed such that an angular load similar to the angular of the primary correcting surface is obtained a the entry surface (#12), in this case characterized by SINIMAX2=0.944. Secondly, this aspheric surface is placed at a position where the absolute value of the subaperture offset, SO2, is similar to, but different from the absolute value of the subaperture offset SO1 at the primary correcting surface (#33). This enables the secondary correcting surface to act essentially on the same aberrations as the primary correcting surface, but with slightly different contributions such that the contributions of the secondary correcting surface complement those of the primary correcting surface significantly. In that sense, the aspheric surfaces of the primary and secondary correcting surfaces complement each other and enable the correction of extreme aperture values.

It is one characterizing feature of this strongly bent positive meniscus lens that an opening angle γ of the concave entry surface (#12) is larger than 60° or 700 such that the entry surface is almost hemispherical. Here, the opening angle γ is defined as the angle included between the optical axis and a straight line between the center of curvature of the curved entry surface and the edge of the optically used area of the surface. In other words, $\gamma=\arcsin(h_{max}/R_C)$, where $R_C$ is the radius of curvature at the vertex of the curved entry surface and $h_{max}$ is the maximum ray height at the surface (corresponding to the free semidiameter ½ Dia. given in the rightmost column of Table 1). One beneficial property of this lens may be explained as follows. Since the opening angle is large, the curved entry surface generates aberration contributions with significant amplitude even at very high orders of aberrations. At the same time, the strongly curved exit surface of the meniscus lens, having very similar radius of curvature and being arranged at a small distance downstream of the entry surface, may compensate a large fraction of the aberrations caused by the entry surface. However, since the maximum incidence angles are significantly smaller at the exit surface, the amplitude of the opposing effect contributed by the exit surface are not as high as the opposite effects of the entry surface particularly in the region of very high orders of aberrations. The resulting net-effect of the combined contributions of the entry surface and exit surface of meniscus L6 may be characterized by relatively small residual aberrations at lower orders of aberration and a significantly higher contribution at higher orders of aberration. Depending on the aspheric shape of the entry surface and exit surface, the relative amplitudes of the residual higher order aberrations may be tailored to a certain extent. The overall aberration contribution may be adapted to the opposing contributions of lenses upstream and downstream of the meniscus lens to compensate those aberrations particularly at very high orders, which are otherwise difficult to correct in very high NA projection objectives.

A further contribution to secondary correction is provided by the image-side aspheric concave surfaces of meniscus lenses L2, L3 arranged upstream of the first pupil surface P1. Specifically, the exit surface (#6) of lens L3 is shaped and arranged such that high incidence angles characterized by SINIMAX=0.936 are obtained at a subaperture offset (SO2=0.936) which is similar to, but significantly different from the subaperture offset S01 at the primary correcting surface.

The combined effect of the primary correcting surfaces of CG1 and the secondary correcting surfaces of CG2 disposed on either side of the final intermediate image (second intermediate image IMI2) in different imaging subsystems of the projection objective allow to obtain a "hyper-aspherical" effect which cannot be obtained by a reasonably shaped single asphere or a group of aspheric lenses positioned at one narrow axial region within the projection objective between a pupil and the next field surface.

It is worth to note that the aspheric correcting surfaces subject to high angular loads characterized by SIMIMAX>0.85 on either side of the first pupil surface P1 within the first refractive object part ROP1 (particularly the exit surface (#6) of lens L3 upstream of the first pupil surface P1 and the entry surface (#12) of the strongly bent meniscus lens L6 immediately downstream of the first pupil surface P1) form a set of spatially separated aspheric correcting surfaces complementing each other in their correcting effect. Since both surfaces are subject to extremely high maximum incidence angles a potential for strong effective is provided. Further, since the relative positions of the first and second subapertures, SA1 and SA2, respectively, on these surfaces upstream and downstream of the first pupil surface are reversed (indicated by opposite signs of the subaperture offset) as explained above, this condition enables the specific influence particularly on the rays at the edge of a pupil which are difficult to correct by a conventional correcting mechanism. Further, since the absolute value of the subaperture offset is similar on both correcting surfaces, but at the same time distinctly different between the correcting surfaces, the mutually enhancing and complementary effect explained above is also obtained for this pair of associated aspheric correcting surfaces.

In this regard, the lenses between the object surface OS and the first pupil surface P1 form an object-side system part and the lenses between the first pupil surface P1 and the image surface IS form an image-side system part including the last optical element where the convergent beam has an aperture $\sin \alpha \geq 0.8$. The meniscus lens L6 forms a first correcting lens having a first (object-side) aspheric correcting surface subject to a first angular load and characterized by a first subaperture offset, and the biaspherical positive meniscus lens L3 having an concave aspheric exit surface may be considered as a second correcting lens having a second aspheric correcting surface subject to a similarly high angular load and a second subaperture offset, which is similar, but slightly different from the first subaperture offset present on the entry surface of lens L6. As explained above, these conditions allow beneficial correction contributions particularly at very high orders.

The exemplary embodiment discussed above is a catadioptric projection objective with exactly two concave mirrors, exactly two intermediate images and three pupil surfaces, where all optical elements are aligned along one straight, unfolded optical axis. Implementation of the disclosure is not restricted to this type of projection objectives. The disclosure can also be incorporated into projection objectives having only one concave mirror, or catadioptric projection objectives having two concave mirrors in a arrangement different from that shown in the figures, or in embodiments having more than two concave mirrors. Also, use of the disclosure can be made independent of whether or not folding mirrors are present in the optical design. Further, the disclosure can be used in catadioptric system having off-axis field (such as exemplarily shown here) or in systems having an axial field (typically centered around the optical axis). The latter type may have a physical beam splitter, such as a polarization selective beam splitter, or may be designed as a system having a central pupil obscuration. Examples of catadioptric systems suitable for incorporation of the disclosure are given e.g. in applicants U.S. applications having Ser. Nos. 60/511,673 (corresponding to WO 2005/040890), 60/560,267 or in US 2002/0012100 A1. The disclosure of these documents is incorporated herein by reference. Other examples are shown in US 2003/0011755 A1 and related applications or in WO 2004/107011A1. The disclosure may also be incorporated into a purely refractive projection objective.

The disclosure can be implemented into projection objectives with any suitable number of intermediate images depending on demand.

The above description has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof.

The contents of all the claims is made part of this description by reference.

TABLE 1

(Shs2040)

| Surface | Radius | Thickness | Material | Index 193.304 nm | ½ Dia | |
|---|---|---|---|---|---|---|
| 0 | 0.0000000000 | 20.212335496700 | | 1.00000000 | 45.500 | |
| 1 | 119.5551584660AS | 20.275988349500 | SIO2 | 1.56028895 | 60.081 | |
| 2 | 421.6186888460AS | 2.149943459590 | | 1.00000000 | 60.456 | |
| 3 | 131.5439690630AS | 27.390959389800 | SIO2 | 1.56028895 | 61.898 | |
| 4 | 109.0568395420AS | 0.878079318194 | | 1.00000000 | 55.875 | |
| 5 | 73.0748854047AS | 37.857924659300 | SIO2 | 1.56028895 | 58.457 | |
| 6 | 86.3266484417AS | 25.755095351900 | | 1.00000000 | 48.778 | |
| 7 | 420.6306069500AS | 20.842884225000 | SIO2 | 1.56028895 | 49.838 | |
| 8 | −160.2403795900 | 0.700000000000 | | 1.00000000 | 52.460 | |
| 9 | 351.3442168420AS | 21.192582411200 | SIO2 | 1.56028895 | 54.514 | |
| 10 | −159.0817523960AS | 0.862265078116 | | 1.00000000 | 54.469 | |
| 11 | 0.0000000000 | 60.200321556900 | | 1.00000000 | 48.619 | |
| 12 | −52.8062327646AS | 23.602598966200 | SIO2 | 1.56028895 | 50.860 | |
| 13 | −67.9513224619AS | 0.700000000000 | | 1.00000000 | 64.744 | |
| 14 | 307.4970691890AS | 27.040234920400 | SIO2 | 1.56028895 | 88.387 | |
| 15 | −692.0120961670 | 1.914524980170 | | 1.00000000 | 89.582 | |
| 16 | 171.8872984110AS | 39.843974519800 | SIO2 | 1.56028895 | 94.426 | |
| 17 | 613.9191656090 | 5.029491580130 | | 1.00000000 | 91.360 | |
| 18 | 444.0311548850AS | 20.941317165700 | SIO2 | 1.56028895 | 90.290 | |
| 19 | −478.9038770400AS | 94.776887828700 | | 1.00000000 | 87.940 | |
| 20 | 261.5849638690 | 262.691698973000 | | 1.00000000 | 73.175 | |
| 21 | −160.9903710800AS | −262.691698973000 | | −1.00000000 | 88.153 | REFL |
| 22 | 262.2604709660AS | 262.691698973000 | | 1.00000000 | 155.676 | REFL |
| 23 | 0.0000000000 | 36.903499214500 | | 1.00000000 | 93.284 | |
| 24 | 147.2185169180AS | 34.605181193900 | SIO2 | 1.56028895 | 80.493 | |
| 25 | 327.5904789100 | 47.957945983600 | | 1.00000000 | 75.741 | |
| 26 | −713.5520020290AS | 7.500000000000 | SIO2 | 1.56028895 | 65.410 | |
| 27 | 334.2295866460 | 18.622035238900 | | 1.00000000 | 62.897 | |
| 28 | 584.4686730880AS | 7.500000000000 | SIO2 | 1.56028895 | 60.917 | |
| 29 | 97.4025913880AS | 26.143468073500 | | 1.00000000 | 59.284 | |
| 30 | 900.0730303180 | 7.500000000000 | SIO2 | 1.56028895 | 61.587 | |
| 31 | 533.6541742280AS | 23.041953494500 | | 1.00000000 | 62.903 | |
| 32 | −202.8948841100AS | 7.500000000000 | SIO2 | 1.56028895 | 66.634 | |
| 33 | 170.1098035730AS | 36.770828792600 | | 1.00000000 | 77.280 | |
| 34 | −243.0552629740AS | 17.402801745900 | SIO2 | 1.56028895 | 82.196 | |
| 35 | −309.7867712240 | 2.461413046620 | | 1.00000000 | 98.142 | |
| 36 | 1472.6085958300AS | 71.26106833100 | SIO2 | 1.56028895 | 122.573 | |
| 37 | −158.3355050230AS | 1.174898142960 | | 1.00000000 | 129.229 | |
| 38 | −23050.2698799000AS | 75.484864489400 | SIO2 | 1.56028895 | 165.322 | |
| 39 | −250.2760189920AS | 0.700000000000 | | 1.00000000 | 169.324 | |
| 40 | 553.2497824440 | 27.060078160500 | SIO2 | 1.56028895 | 177.115 | |
| 41 | 674.5873876790AS | 0.700000000000 | | 1.00000000 | 176.701 | |
| 42 | 179.8540211860AS | 55.501000000000 | SIO2 | 1.56028895 | 158.549 | |
| 43 | 280.1006618840AS | 0.700000000000 | | 1.00000000 | 156.014 | |
| 44 | 148.1172595640AS | 54.341134037200 | SIO2 | 1.56028895 | 131.287 | |
| 45 | 375.7489629580AS | 0.700000000000 | | 1.00000000 | 126.926 | |
| 46 | 117.3056311950AS | 39.000000000000 | SIO2 | 1.56028895 | 91.687 | |
| 47 | 235.5865382940AS | 0.700000000000 | | 1.00000000 | 87.537 | |
| 48 | 44.2707941352AS | 52.908583896500 | SIO2 | 1.56028895 | 44.271 | |
| 49 | 0.0000000000 | 1.000000000000 | DEKALIN | 1.64200000 | 13.619 | |
| 50 | 0.0000000000 | 0.000000000000 | | 1.00000000 | 11.375 | |

TABLE 1A

Aspherical Constats

SURFACE # 1

| | |
|---|---|
| K | 0.000000000000 |
| C1 | 3.77189258018e−008 |
| C2 | 8.13787235196e−012 |
| C3 | −6.11178254614e−015 |
| C4 | −7.49553334917e−019 |
| C5 | 3.27347151254e−022 |
| C6 | −5.21594775613e−026 |
| C7 | −1.56589972029e−030 |
| C8 | 0.00000000000e+000 |
| C9 | 0.00000000000e+000 |

TABLE 1A-continued

Aspherical Constats

SURFACE # 2

| | |
|---|---|
| K | 0.000000000000 |
| C1 | −1.52142545116e−007 |
| C2 | 4.42999246397e−011 |
| C3 | −6.03801488030e−015 |
| C4 | −2.79708190086e−019 |
| C5 | 2.25280098802e−022 |
| C6 | −6.08336299040e−026 |
| C7 | −7.21013877739e−031 |
| C8 | 0.00000000000e+000 |
| C9 | 0.00000000000e+000 |

TABLE 1A-continued

Aspherical Constats

SURFACE # 3

| | |
|---|---|
| K | 0.000000000000 |
| C1 | −2.51634682780e−007 |
| C2 | 4.72119227726e−011 |
| C3 | 1.12358584392e−014 |
| C4 | 1.37364189841e−019 |
| C5 | −1.37168434601e−022 |
| C6 | −1.87282420662e−026 |
| C7 | 3.42621213888e−030 |
| C8 | 0.00000000000e+000 |
| C9 | 0.00000000000e+000 |

SURFACE # 4

| | |
|---|---|
| K | 0.000000000000 |
| C1 | −3.83848496207e−008 |
| C2 | −8.74890021007e−012 |
| C3 | 2.43802707738e−014 |
| C4 | −7.06889575775e−019 |
| C5 | 2.02734234712e−022 |
| C6 | 1.14812903843e−025 |
| C7 | −5.58206182470e−030 |
| C8 | 0.00000000000e+000 |
| C9 | 0.00000000000e+000 |

SURFACE # 5

| | |
|---|---|
| K | 0.000000000000 |
| C1 | 9.66183616909e−008 |
| C2 | −2.02136666507e−012 |
| C3 | −1.86489425024e−015 |
| C4 | −2.86425967466e−019 |
| C5 | −2.49038859559e−023 |
| C6 | 8.74905394581e−026 |
| C7 | −2.22261844361e−029 |
| C8 | 0.00000000000e+000 |
| C9 | 0.00000000000e+000 |

SURFACE # 6

| | |
|---|---|
| K | 0.000000000000 |
| C1 | 6.80551651186e−007 |
| C2 | 1.45817719991e−010 |
| C3 | 2.52940350723e−014 |
| C4 | −2.52132958043e−018 |
| C5 | 3.88364195664e−022 |
| C6 | 1.74353693998e−025 |
| C7 | 1.37414298171e−028 |
| C8 | 0.00000000000e+000 |
| C9 | 0.00000000000e+000 |

SURFACE # 7

| | |
|---|---|
| K | 0.000000000000 |
| C1 | −2.31364194958e−007 |
| C2 | −1.30998377953e−010 |
| C3 | 2.63653195650e−014 |
| C4 | −3.00847618249e−018 |
| C5 | −4.19934382179e−022 |
| C6 | 2.46989885853e−025 |
| C7 | −8.65161167316e−029 |
| C8 | 0.00000000000e+000 |
| C9 | 0.00000000000e+000 |

SURFACE # 9

| | |
|---|---|
| K | 0.000000000000 |
| C1 | −3.07885578244e−007 |
| C2 | 7.01067163507e−011 |
| C3 | 1.27719551691e−017 |
| C4 | −3.02757016945e−019 |
| C5 | −6.09784464857e−023 |
| C6 | 3.08394046847e−025 |
| C7 | −1.05494876084e−029 |
| C8 | 0.00000000000e+000 |
| C9 | 0.00000000000e+000 |

SURFACE # 10

| | |
|---|---|
| K | 0.000000000000 |
| C1 | −3.07523703409e−008 |
| C2 | −6.19911041601e−012 |
| C3 | 3.36296264722e−015 |
| C4 | 5.21963863219e−019 |
| C5 | −1.86470616594e−022 |
| C6 | 1.68605836113e−025 |
| C7 | −1.64878270999e−029 |
| C8 | 0.00000000000e+000 |
| C9 | 0.00000000000e+000 |

SURFACE # 12

| | |
|---|---|
| K | 0.0000000000000 |
| C1 | 2.69249880118e−008 |
| C2 | 1.63313723498e−011 |
| C3 | −4.72050978954e−017 |
| C4 | 1.20424910935e−018 |
| C5 | 5.29322836908e−022 |
| C6 | −4.17976146321e−025 |
| C7 | 1.00858383664e−028 |
| C8 | 0.00000000000e+000 |
| C9 | 0.00000000000e+000 |

SURFACE # 13

| | |
|---|---|
| K | 0.000000000000 |
| C1 | 2.09310548629e−008 |
| C2 | 5.50374060541e−012 |
| C3 | 1.15378096299e−016 |
| C4 | 3.20903618970e−019 |
| C5 | −1.02889022533e−022 |
| C6 | 1.96458878485e−026 |
| C7 | −1.79894237023e−030 |
| C8 | 0.00000000000e+000 |
| C9 | 0.00000000000e+000 |

SURFACE # 14

| | |
|---|---|
| K | 0.000000000000 |
| C1 | −2.31127241031e−008 |
| C2 | 3.14253548889e−013 |
| C3 | 1.50104905210e−016 |
| C4 | 5.75906512937e−021 |
| C5 | −1.36387897940e−024 |
| C6 | −1.00652488428e−028 |
| C7 | 1.04799993993e−032 |
| C8 | 0.00000000000e+000 |
| C9 | 0.00000000000e+000 |

SURFACE # 16

| | |
|---|---|
| K | 0.000000000000 |
| C1 | 2.32045834567e−010 |
| C2 | 1.37721874788e−012 |
| C3 | −9.25411359093e−017 |
| C4 | 3.48566987258e−021 |
| C5 | −1.92023119836e−026 |
| C6 | 4.35909508659e−029 |
| C7 | 1.70293516587e−033 |
| C8 | 0.00000000000e+000 |
| C9 | 0.00000000000e+000 |

SURFACE # 18

| | |
|---|---|
| K | 0.000000000000 |
| C1 | −3.20191802734e−008 |
| C2 | 8.06216598896e−013 |
| C3 | 2.23846352100e−017 |
| C4 | −3.37783304131e−021 |
| C5 | −2.68775904345e−025 |
| C6 | 4.87166242716e−030 |
| C7 | −1.73686036192e−034 |
| C8 | 0.00000000000e+000 |
| C9 | 0.00000000000e+000 |

SURFACE # 19

| | |
|---|---|
| K | 0.000000000000 |
| C1 | 1.58448427947e−007 |
| C2 | −2.02521796045e−012 |
| C3 | 5.78460196396e−017 |
| C4 | 3.72269113005e−021 |
| C5 | −9.76281520453e−025 |
| C6 | −2.10196359946e−029 |
| C7 | 1.52900881488e−032 |

TABLE 1A-continued

Aspherical Constats

|   |   |
|---|---|
| C8 | 0.00000000000e+000 |
| C9 | 0.00000000000e+000 |

SURFACE # 21

|   |   |
|---|---|
| K | −0.111023939969 |
| C1 | 1.55128663321e−008 |
| C2 | 3.77437039515e−013 |
| C3 | 6.51904658071e−018 |
| C4 | 2.15162225894e−022 |
| C5 | 3.01587535179e−026 |
| C6 | −2.02851086702e−030 |
| C7 | 7.05214283556e−035 |
| C8 | 0.00000000000e+000 |
| C9 | 0.00000000000e+000 |

SURFACE # 22

|   |   |
|---|---|
| K | −0.346909099724 |
| C1 | 3.25995875835e−010 |
| C2 | 1.44869739418e−015 |
| C3 | 3.86872780697e−020 |
| C4 | −3.50683097105e−024 |
| C5 | 1.74483348387e−028 |
| C6 | −4.37288455876e−033 |
| C7 | 4.26486527444e−038 |
| C8 | 0.00000000000e+000 |
| C9 | 0.00000000000e+000 |

SURFACE # 24

|   |   |
|---|---|
| K | 0.000000000000 |
| C1 | 2.67887354367e−008 |
| C2 | 1.12508757567e−012 |
| C3 | 5.25600390349e−017 |
| C4 | 2.48177170660e−021 |
| C5 | 5.47192791259e−025 |
| C6 | −1.85001319633e−029 |
| C7 | 1.61752468917e−033 |
| C8 | 0.00000000000e+000 |
| C9 | 0.00000000000e+000 |

SURFACE # 26

|   |   |
|---|---|
| K | 0.000000000000 |
| C1 | 3.78042455968e−008 |
| C2 | 3.63604743039e−012 |
| C3 | −1.75009002132e−015 |
| C4 | 3.62517378442e−019 |
| C5 | −2.78518001264e−023 |
| C6 | 1.30574146909e−027 |
| C7 | −2.64243321271e−032 |
| C8 | 0.00000000000e+000 |
| C9 | 0.00000000000e+000 |

SURFACE # 28

|   |   |
|---|---|
| K | 0.000000000000 |
| C1 | −1.17649730032e−007 |
| C2 | 1.64963763064e−011 |
| C3 | −4.64269505102e−015 |
| C4 | −1.10796738585e−018 |
| C5 | 3.05097091441e−022 |
| C6 | −3.84991229049e−026 |
| C7 | 2.37840533100e−030 |
| C8 | 0.00000000000e+000 |
| C9 | 0.00000000000e+000 |

SURFACE # 29

|   |   |
|---|---|
| K | 0.000000000000 |
| C1 | −7.59731859628e−008 |
| C2 | 2.84658431450e−011 |
| C3 | −6.61455921131e−015 |
| C4 | −1.77425394129e−018 |
| C5 | 1.04522585488e−022 |
| C6 | −4.82091099253e−027 |
| C7 | 1.49492753470e−030 |
| C8 | 0.00000000000e+000 |
| C9 | 0.00000000000e+000 |

SURFACE # 31

|   |   |
|---|---|
| K | 0.000000000000 |
| C1 | 1.65982508028e−008 |
| C2 | 7.43474700255e−012 |
| C3 | 1.09894092302e−015 |
| C4 | 3.89050606678e−019 |
| C5 | −4.15675377769e−024 |
| C6 | 3.03705531299e−027 |
| C7 | 0.00000000000e+000 |
| C8 | 0.00000000000e+000 |
| C9 | 0.00000000000e+000 |

SURFACE # 32

|   |   |
|---|---|
| K | 0.000000000000 |
| C1 | 1.50936151860e−007 |
| C2 | 2.91415403001e−012 |
| C3 | −2.71060782532e−015 |
| C4 | 6.33197859594e−019 |
| C5 | −6.95365406559e−023 |
| C6 | 7.16242091294e−027 |
| C7 | −1.33707181958e−030 |
| C8 | 0.00000000000e+000 |
| C9 | 0.00000000000e+000 |

SURFACE # 33

|   |   |
|---|---|
| K | 0.000000000000 |
| C1 | 3.81788732256e−008 |
| C2 | −5.27165102168e−012 |
| C3 | −4.67433810309e−015 |
| C4 | 9.52834183001e−019 |
| C5 | −9.24814378797e−023 |
| C6 | 4.47138302725e−027 |
| C7 | −6.56309645811e−032 |
| C8 | 0.00000000000e+000 |
| C9 | 0.00000000000e+000 |

SURFACE # 34

|   |   |
|---|---|
| K | 0.000000000000 |
| C1 | −4.07873512551e−008 |
| C2 | 2.35470624139e−012 |
| C3 | −1.28792315583e−016 |
| C4 | −1.65584611776e−020 |
| C5 | 6.75898727466e−025 |
| C6 | −1.73166557639e−028 |
| C7 | −5.93299935834e−033 |
| C8 | 0.00000000000e+000 |
| C9 | 0.00000000000e+000 |

SURFACE # 36

|   |   |
|---|---|
| K | 0.000000000000 |
| C1 | −3.79565329622e−008 |
| C2 | 3.51593309349e−013 |
| C3 | −1.52142002608e−017 |
| C4 | −4.58109418142e−024 |
| C5 | 3.07849389655e−026 |
| C6 | −1.14644299128e−030 |
| C7 | −3.24185995258e−035 |
| C8 | 0.00000000000e+000 |
| C9 | 0.00000000000e+000 |

SURFACE # 37

|   |   |
|---|---|
| K | 0.000000000000 |
| C1 | 9.37646375535e−009 |
| C2 | −1.41556521534e−013 |
| C3 | −6.94901500693e−018 |
| C4 | 2.86610748985e−024 |
| C5 | −9.37745675403e−027 |
| C6 | −7.30362894268e−031 |
| C7 | 0.00000000000e+000 |
| C8 | 0.00000000000e+000 |
| C9 | 0.00000000000e+000 |

SURFACE # 38

|   |   |
|---|---|
| K | 0.000000000000 |
| C1 | −6.46429691505e−010 |
| C2 | −1.42707761613e−014 |

TABLE 1A-continued

Aspherical Constats

|  |  |
|---|---|
| C3 | −1.38074705665e−019 |
| C4 | −1.95487574614e−024 |
| C5 | 2.03412448575e−027 |
| C6 | −4.34111952875e−032 |
| C7 | −3.65676509106e−038 |
| C8 | 0.00000000000e+000 |
| C9 | 0.00000000000e+000 |

SURFACE # 39

|  |  |
|---|---|
| K | 0.000000000000 |
| C1 | 1.44961248077e−010 |
| C2 | 9.02386577134e−015 |
| C3 | 4.75142423640e−019 |
| C4 | 2.05892534405e−023 |
| C5 | 7.24005406590e−028 |
| C6 | 0.00000000000e+000 |
| C7 | 0.00000000000e+000 |
| C8 | 0.00000000000e+000 |
| C9 | 0.00000000000e+000 |

SURFACE # 41

|  |  |
|---|---|
| K | 0.000000000000 |
| C1 | −1.06727062035e−008 |
| C2 | 7.70183880409e−014 |
| C3 | −7.81015345012e−018 |
| C4 | −2.84083004272e−022 |
| C5 | 1.38124581198e−026 |
| C6 | −1.70054621505e−031 |
| C7 | 6.28617305822e−037 |
| C8 | 0.00000000000e+000 |
| C9 | 0.00000000000e+000 |

SURFACE # 42

|  |  |
|---|---|
| K | 0.000000000000 |
| C1 | 1.55104600199e−010 |
| C2 | 3.85290212670e−015 |
| C3 | −2.58559997641e−019 |
| C4 | −1.95486707121e−023 |
| C5 | 2.08773442391e−029 |
| C6 | 9.11614134503e−034 |
| C7 | −5.52783098020e−039 |
| C8 | 0.00000000000e+000 |
| C9 | 0.00000000000e+000 |

SURFACE # 43

|  |  |
|---|---|
| K | 0.000000000000 |
| C1 | −2.15871187404e−009 |
| C2 | −1.96327214451e−013 |
| C3 | −1.33961313242e−018 |
| C4 | −9.32571255029e−023 |
| C5 | 4.24171518931e−027 |
| C6 | 4.53298909889e−032 |
| C7 | 9.68466751278e−037 |
| C8 | 0.00000000000e+000 |
| C9 | 0.00000000000e+000 |

TABLE 1A-continued

Aspherical Constats

SURFACE # 44

|  |  |
|---|---|
| K | 0.000000000000 |
| C1 | −5.23209145000e−009 |
| C2 | 1.51213239551e−014 |
| C3 | 1.44059394860e−017 |
| C4 | −7.36003099864e−023 |
| C5 | −1.87422004554e−026 |
| C6 | 3.46768537730e−032 |
| C7 | 4.67216370024e−035 |
| C8 | 0.00000000000e+000 |
| C9 | 0.00000000000e+000 |

SURFACE # 45

|  |  |
|---|---|
| K | 0.000000000000 |
| C1 | 9.17259359949e−009 |
| C2 | 2.00419403064e−013 |
| C3 | 1.02380854942e−016 |
| C4 | −6.30894009395e−021 |
| C5 | 2.73001731844e−025 |
| C6 | −3.83718791727e−030 |
| C7 | 2.42828225337e−035 |
| C8 | 0.00000000000e+000 |
| C9 | 0.00000000000e+000 |

SURFACE # 46

|  |  |
|---|---|
| K | 0.000000000000 |
| C1 | 1.21014255783e−007 |
| C2 | 3.29604153103e−012 |
| C3 | 3.65510540034e−016 |
| C4 | 4.69350127547e−020 |
| C5 | 2.40699298795e−025 |
| C6 | 1.51158060442e−028 |
| C7 | 4.66703123160e−032 |
| C8 | 0.00000000000e+000 |
| C9 | 0.00000000000e+000 |

SURFACE # 47

|  |  |
|---|---|
| K | 0.000000000000 |
| C1 | 1.13029574654e−007 |
| C2 | 1.56658087381e−012 |
| C3 | 3.91584885341e−016 |
| C4 | −2.57543359476e−020 |
| C5 | −2.93995079790e−024 |
| C6 | −2.28925016210e−028 |
| C7 | 2.30154625683e−032 |
| C8 | 0.00000000000e+000 |
| C9 | 0.00000000000e+000 |

SURFACE # 48

|  |  |
|---|---|
| K | 0.000000000000 |
| C1 | −1.93847119410e−008 |
| C2 | −6.49921933225e−012 |
| C3 | −4.59889867729e−017 |
| C4 | −2.01191612902e−018 |
| C5 | 1.99675276146e−021 |
| C6 | −1.30625456961e−024 |
| C7 | 2.85574781404e−028 |
| C8 | 0.00000000000e+000 |
| C9 | 0.00000000000e+000 |

TABLE 1S

| Surface | SINIMAX | H1 | H2 | D1 | D2 | SO | |
|---|---|---|---|---|---|---|---|
| 0 |  | 17.500 | 45.500 | 0.000 | 0.000 | inf | OS |
| 1 | 0.741 | 18.054 | 47.621 | −17.747 | −24.919 | −1.386 | |
| 2 | 0.456 | 16.627 | 44.865 | −26.022 | −31.180 | −0.987 | |
| 3 | 0.690 | 16.783 | 44.437 | −28.300 | −34.921 | −0.875 | |
| 4 | 0.811 | 14.134 | 35.844 | −38.611 | −40.062 | −0.552 | |
| 5 | 0.899 | 14.723 | 36.729 | −40.787 | −43.456 | −0.522 | |
| 6 | 0.936 | 9.230 | 23.517 | −51.015 | −50.522 | −0.281 | x |
| 7 | 0.695 | 4.693 | 12.242 | −74.374 | −75.192 | −0.101 | |

TABLE 1S-continued

| Surface | SINIMAX | H1 | H2 | D1 | D2 | SO | |
|---|---|---|---|---|---|---|---|
| 8 | 0.433 | 3.651 | 9.771 | −83.376 | −85.378 | −0.073 | |
| 9 | 0.581 | 3.274 | 9.078 | −88.768 | −90.872 | −0.065 | |
| 10 | 0.472 | 2.357 | 6.774 | −92.807 | −95.390 | −0.047 | |
| 11 | 0.403 | −0.253 | −0.192 | −97.154 | −98.384 | −0.001 | P1 |
| 12 | 0.944 | −0.981 | −2.441 | −98.231 | −96.838 | 0.015 | x |
| 13 | 0.802 | −1.896 | −4.759 | −122.474 | −119.971 | 0.024 | |
| 14 | 0.602 | −6.533 | −16.501 | −141.954 | −143.772 | 0.070 | |
| 15 | 0.250 | −7.011 | −17.680 | −143.144 | −143.804 | 0.074 | |
| 16 | 0.690 | −8.205 | −20.939 | −144.072 | −146.975 | 0.088 | |
| 17 | 0.271 | −8.902 | −22.772 | −135.175 | −137.177 | 0.102 | |
| 18 | 0.289 | −9.008 | −22.987 | −132.997 | −134.607 | 0.104 | |
| 19 | 0.384 | −9.304 | −23.635 | −128.078 | −128.610 | 0.112 | |
| 20 | 0.346 | −13.341 | −33.829 | −79.478 | −78.691 | 0.259 | |
| 21 | 0.377 | −24.499 | −60.386 | 45.493 | 44.374 | −0.799 | REFL |
| 22 | 0.309 | 43.027 | 104.054 | 24.602 | 35.759 | 2.022 | REFL |
| 23 | 0.318 | 24.830 | 62.729 | −45.015 | −37.812 | −0.915 | |
| 24 | 0.585 | 22.474 | 55.442 | −55.577 | −50.102 | −0.624 | |
| 25 | 0.338 | 19.070 | 48.403 | −56.884 | −54.675 | −0.526 | |
| 26 | 0.528 | 12.844 | 32.982 | −63.635 | −64.856 | −0.313 | |
| 27 | 0.404 | 12.125 | 30.737 | −64.493 | −64.320 | −0.289 | |
| 28 | 0.415 | 10.075 | 25.667 | −69.827 | −70.502 | −0.222 | |
| 29 | 0.718 | 9.389 | 23.800 | −71.572 | −70.969 | −0.202 | |
| 30 | 0.491 | 7.133 | 18.160 | −87.403 | −86.854 | −0.127 | |
| 31 | 0.605 | 6.961 | 17.635 | −91.147 | −90.534 | −0.118 | |
| 32 | 0.340 | 5.690 | 14.266 | −104.494 | −104.737 | −0.082 | |
| 33 | 0.957 | 6.404 | 16.262 | −120.989 | −122.035 | −0.081 | x |
| 34 | 0.563 | 2.080 | 5.541 | −153.718 | −153.310 | −0.023 | |
| 35 | 0.654 | 2.320 | 6.239 | −184.240 | −183.807 | −0.021 | |
| 36 | 0.779 | 2.873 | 7.895 | −230.353 | −229.355 | −0.022 | |
| 37 | 0.447 | 1.693 | 4.691 | −249.931 | −249.076 | −0.012 | |
| 38 | 0.466 | 2.968 | 8.440 | −314.710 | −313.763 | −0.017 | |
| 39 | 0.579 | 2.381 | 6.802 | −325.894 | −325.043 | −0.014 | |
| 40 | 0.397 | 2.182 | 6.535 | −341.856 | −341.159 | −0.013 | |
| 41 | 0.362 | 2.197 | 6.596 | −340.818 | −340.210 | −0.013 | |
| 42 | 0.797 | 0.547 | 1.930 | −313.823 | −313.233 | −0.004 | |
| 43 | 0.170 | 0.784 | 2.781 | −307.177 | −306.456 | −0.007 | |
| 44 | 0.541 | 0.114 | 0.636 | −261.613 | −261.281 | −0.002 | |
| 45 | 0.253 | 0.138 | 0.894 | −252.514 | −252.020 | −0.003 | |
| 46 | 0.375 | −0.213 | −0.368 | −182.786 | −182.638 | 0.001 | |
| 47 | 0.575 | −0.503 | −0.919 | −173.557 | −173.236 | 0.002 | |
| 48 | 0.430 | −0.095 | −0.231 | −88.269 | −88.079 | 0.002 | |
| 49 | 0.962 | −4.381 | −11.374 | −4.491 | −4.489 | 1.557 | |
| 50 | | −4.375 | −11.375 | 0.000 | 0.000 | −189187.296 | IS |

What is claimed is:

1. A projection objective configured to image a pattern provided in an object surface of the projection objective onto an image surface of the projection objective, the projection objective comprising:

an object-side imaging subsystem configured to create an intermediate image closest to the image surface from radiation coming from the object surface; and an image-side imaging subsystem configured to directly image the intermediate image onto the image surface, the image-side imaging subsystem comprising:

a diverting lens group configured to create a divergent beam from radiation coming from the intermediate image;

a converging lens group including an optical element closest to the image surface configured to convert the divergent beam into a convergent beam having an aperture sin $\alpha \geqq 0.8$ in the optical element to provide an image-side numerical aperture NA;

a primary correcting group including a primary correcting lens having an aspheric primary correcting surface formed by an image-side concave surface, the primary correcting group being in a region of the divergent beam such that a primary angular load defined by a primary local maximum SINIMAX1 for the sine of the angle of incidence of radiation on the aspheric primary correcting surface of the correcting lens is obtained and such that a primary subaperture offset SO1 is given on the primary correcting surface; and a secondary correcting group including at least one secondary correcting lens having an aspheric secondary correcting surface, wherein the secondary correcting surface is shaped and arranged such that a secondary local maximum SINIMAX2 for the sine of the angle of incidence similar to the primary local maximum SINIMAX1 is obtained on the secondary correcting surface and arranged at a position where an absolute value of a secondary subaperture offset SO2 is similar to, but different from, the absolute value of the first subaperture offset S01, where a subaperture offset SO between a first subaperture SA1 corresponding to a first object point of minimum height and a second subaperture SO2 corresponding to a second object point with maximum height is defined as:

$$SO = D_{SA}/DIA_{SA},$$

where $D_{SA}$ is a distance between the centers of the first and the second subaperture in an offset direction and $DIA_{SA}$ is the mean value of the diameters of the first and second subaperture in the offset direction.

2. The projection objective according to claim 1, wherein the following conditions are fulfilled
   (1) SINIMAX1>0.85
   (2) SINIMAX2>0.85
   (3) |SO1|/|SO2|≠1
   (4) LL≦|(SO1/SO2)|≦UL
where LL=3 and UL=25, or LL=1/25 and UL=1/3.

3. The projection objective according to claim 2, wherein LL=3 and UL=6, or LL=1/6 and UL=1/3.

4. The projection objective according to claim 2, wherein at least one of the following conditions is fulfilled for the absolute value |(SO1/SO2)| of the subaperture offset ratio:
   (1) LL=3 and UL=4, or LL=1/4 and UL=1/3;
   (2) LL=5 and UL=6, or LL=1/6 and UL=1/5; and
   (3) LL=15 and UL=25, or LL=1/25 and UL=1/15.

5. The projection objective according to claim 1, wherein NA≧1.35.

6. The projection objective according to claim 1, wherein an aspheric correcting surface is positioned such that one of the following three conditions (1) to (3) is fulfilled for the absolute value |SO| of the subaperturte offset, and another aspheric correcting surface is present at a position where one of the other two remaining conditions is fulfilled, where the conditions are as follows:
   (1) 0<|SO|<0.025;
   (2) 0.04<|SO|<0.120; and
   (3) 0.200<|SO|<0.400.

7. The projection objective according to claim 1, wherein SINIMAX1>0.925 and SINIMAX2>0.925.

8. The projection objective according to claim 1, wherein SINIMAX1>SINIMAX2.

9. The projection objective according to claim 1, wherein the primary correcting lens is a negative lens having an image-side concave surface immediately followed by a group of five lenses including at least four positive lenses.

10. The projection objective according to claim 1, wherein there are only positive lenses between the primary correcting lens and the image surface.

11. The projection objective according to claim 1, wherein at least five positive lenses are arranged between the primary correcting lens and the image surface.

12. The projection objective according to claim 1, wherein at least 80% of all lenses between the primary correcting lens and the image surface are positive lenses.

13. The projection objective according to claim 1, wherein the primary correcting group includes at least two negative lenses having aspheric image-side concave surfaces arranged in the region of divergent beam.

14. The projection objective according to claim 1, wherein the primary correcting lens is a biconcave negative lens.

15. The projection objective according to claim 1, wherein the primary correcting lens is a biaspherical lens having an aspheric entry surface and an aspheric exit surface.

16. The projection objective according to claim 1, wherein the secondary correcting group includes a secondary correcting lens formed by a lens having an aspheric object-side concave surface arranged in a position selected such that the primary subaperture offset and the secondary subaperture offset have opposite signs.

17. The projection objective according to claim 1, wherein at least one secondary correcting lens is a mensicus lens.

18. The projection objective according to claim 17, wherein the meniscus lens is bent strongly such that an opening angle γ of the apheric correcting surface exceeds 60°.

19. The projection objective according to claim 1, wherein at least one secondary correcting lens is a biaspherical lens.

20. The projection objective according to claim 1, wherein the secondary correcting group includes a secondary correcting lens having an image-side aspheric concave surface arranged at a position where the primary and secondary subaperture offset have the same sign.

21. The projection objective according to claim 20, wherein the lens having an aspheric image-side concave surface is a meniscus lens.

22. The projection objective according to claim 20, wherein the secondary correcting lens having an aspheric image-side concave surface is a biaspherical lens having an aspheric entry surface and an aspheric exit surface.

23. The projection objective according to claim 1, wherein the last optical element is made of a material having refractive index $n_{LOE}$ and wherein the image-side numerical aperture is in the range $0.95* n_{LOE}<NA<n_{LOE}$.

24. The projection objective according to claim 1, wherein the last optical element is made of fused silica and wherein the image-side numerical aperture is in the range 1.35<NA≦1.50.

25. The projection objective according to claim 1, wherein all refractive optical elements are made of the same material and wherein the image-side numerical aperture is in the range 1.35<NA≦1.50.

26. The projection objective according to claim 25, wherein the same material used for all refractive optical elements is fused silica.

27. The projection objective of claim 1, wherein NA>1.35, and all the lenses are made of fused silica.

28. The projection objective according to claim 27, wherein the image-side numerical aperture is in the range 1.35<NA≦1.50.

29. The projection objective according to claim 27, wherein the projection objective is a catadioptric projection objective, and wherein the projection objective includes at least one concave mirror.

30. The projection objective according to claim 27, wherein the projection objective is rotational symmetric and has one straight optical axis common to all optical elements.

31. The projection objective according to claim 30, wherein the projection objective is a catadioptric projection objective and wherein the optical elements include exactly two concave mirrors.

32. A projection objective configured to image a pattern provided in an object surface of the projection objective onto an image surface of the projection objective, the projection objective comprising:
   an object-side imaging subsystem configured to create an intermediate image closest to the image surface from radiation coming from the object surface, the object-side imaging subsystem including a first pupil surface closest to the object surface;
   an image-side imaging subsystem configured to directly image the intermediate image onto the image surface; and
   an aspheric lens arranged immediately downstream of the first pupil surface, the aspheric lens having an aspheric object-side concave entry surface facing the pupil surface,
   wherein the aspheric object-side concave entry surface has an opening angle γ>60°, and the opening angle γ of a curved surface is defined as the angle included between an optical axis and a straight line between a center of curvature at the vertex of the curved surface and an edge of the optically used area of the curved surface.

33. The projection objective according to claim 32, wherein γ>80°.

34. The projection objective according to claim 32, wherein the aspheric lens is cut asymmetrically.

35. The projection objective according to claim 32, wherein the aspheric lens has positive refractive power.

36. The projection objective according to claim 32, wherein the aspheric lens is a meniscus lens.

37. The projection objective according to claim 32, wherein the aspheric lens is a biaspherical lens.

38. The projection objective according to claim 32, wherein the projection objective has at least one aspheric lens between the object surface and the first pupil surface, the aspheric lens has an image-side concave exit surface facing the pupil surface, and the image-side concave exit surface is aspheric and has an opening angle $\gamma > 60°$.

39. The projection objective according to claim 38, wherein the aspheric lens between the object surface and the first pupil surface has positive refractive power.

40. The projection objective according to claim 38, wherein the aspheric lens between the object surface and the first pupil surface is a meniscus lens.

41. The projection objective according to claim 38, wherein the aspheric lens between the object surface and the first pupil surface is a biaspherical lens.

42. The projection objective according to claim 38, wherein the projection objective has two pupil surfaces and exactly one intermediate image.

43. The projection objective according to claim 38, wherein the projection objective has exactly two intermediate images and three pupil surfaces.

44. A projection objective configured to image a pattern provided in an object surface of the projection objective onto an image surface of the projection objective, the projection objective having at least one pupil surface, the projection objective comprising:

an object-side system part between the object surface and the pupil surface, the object-side system part configured to guide radiation coming from the object surface towards the pupil surface; and an image-side system part configured to guide radiation coming from the pupil surface onto the image surface, the image-side system part comprising:

a last optical element closest to the image surface and being designed to create a convergent beam having an aperture $\sin \alpha \geq 0.8$ in the last optical element to provide an image-side numerical aperture NA; and a first correcting group including at least one first correcting lens having a first aspheric correcting surface formed by a concave surface of the first correcting lens and arranged such that a first angular load defined by a first local maximum SINIMAX1 for the sine of the angle of incidence is obtained and such that a first subaperture offset SO1 is given on the first correcting surface;

wherein:

the object-side system part comprises a second correcting group having at least one second correcting lens having a second aspheric correcting surface; and the second correcting surface is shaped and arranged such that a second local maximum SINIMAX2 for the sine of the angle of incidence similar to the first local maximum SINIMAX1 is obtained on the second correcting surface and arranged at a position where an absolute value of a second subaperture offset SO2 is similar to, but different from, the absolute value of the first subaperture offset SO1, where a subaperture offset SO between a first subaperture SA1 corresponding to a first object point of minimum height and a second subaperture SO2 corresponding to a second object point with maximum height is defined as:

$SO = D_{SA}/DIA_{SA}$, and where $D_{SA}$ is a distance between the centers of the first and the second subaperture in an offset direction and $DIA_{SA}$ is the mean value of the diameters of the first and second subaperture in the offset direction.

45. The projection objective according to claim 44, wherein the following conditions are fulfilled
(1) SINIMAX1>0.85
(2) SINIMAX2>0.85
(3) |SO1|/|SO2|≠1
(4) LL≦|(SO1/SO2)|≦UL
where LL=3 and UL =25, or LL =⅟25 and UL=⅓.

46. The projection objective according to claim 44, wherein the first correcting lens is arranged immediately downstream of the pupil surface and has an aspheric object-side concave entry surface facing the pupil surface, wherein that entry surface forms the first aspheric correcting surface and has an opening angle $\gamma > 60°$.

47. The projection objective according to claim 44, wherein the second correcting lens is an aspheric lens having an image-side concave exit surface facing the pupil surface and wherein that exit surface forms the second aspheric correcting surface and has an opening angle $\gamma > 60°$.

48. The projection objective according to claim 44, wherein the pupil surface is a first pupil surface closest to the object surface.

49. The projection objective according to claim 44, wherein no intermediate image is formed between the first correcting lens and the second correcting lens.

50. The projection objective according to claim 44, wherein NA≧1.35.

\* \* \* \* \*

UNITED STATES PATENT AND TRADEMARK OFFICE
CERTIFICATE OF CORRECTION

PATENT NO. : 7,787,177 B2
APPLICATION NO. : 12/026592
DATED : August 31, 2010
INVENTOR(S) : Karl-Heinz Schuster It is certified that error appears in the above-identified patent and that said Letters Patent is hereby corrected as shown below:

Column 2,
Line 22, Delete "$n_{SIO2}=0.56$" and insert --$n_{SiO2}=0.56$--

Column 6,
Line 51, Delete "subaperturte" and insert --subaperture--

Column 7,
Line 60, Delete "mensicus" and insert --meniscus--

Column 8,
Line 20, Delete "similary" and insert --similarly--

Column 9,
Line 52, Delete "correaction" and insert --correction--

Column 12,
Line 55, Delete "decetered" and insert --decentered--

Column 13,
Line 27, After "OF" insert --.--

Column 29,
Line 21, Delete "| SO |²" and insert --| SO |--

Column 29,
Line 21, Delete "subaperturte" and insert --subaperture--

Column 29,
Line 62, Delete "mensicus" and insert --meniscus--

Column 29,
Line 65, Delete "apheric" and insert --aspheric--

Signed and Sealed this

Fourteenth Day of December, 2010

David J. Kappos
*Director of the United States Patent and Trademark Office*